(12) United States Patent
Baba

(10) Patent No.: US 6,335,577 B1
(45) Date of Patent: Jan. 1, 2002

(54) POWER SUPPLY CONTROL UNIT AND POWER SUPPLY CONTROL METHOD

(75) Inventor: Akira Baba, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/501,785

(22) Filed: Feb. 11, 2000

(30) Foreign Application Priority Data

Feb. 12, 1999 (JP) .......................................... 11-035009
Jan. 19, 2000 (JP) .......................................... 12-010875

(51) Int. Cl.$^7$ ................................................. H02J 3/00
(52) U.S. Cl. ................................................. 307/28; 307/64
(58) Field of Search ........................... 307/64, 66, 130, 307/28; 323/265, 266, 274, 277, 278; 361/18, 93.8, 103

(56) References Cited

U.S. PATENT DOCUMENTS

| | | | |
|---|---|---|---|
| 4,308,492 A | * 12/1981 | Mori et al. ................ | 323/282 |
| 5,382,839 A | * 1/1995 | Shinohara ................... | 327/545 |
| 5,828,204 A | * 10/1998 | Jansen ........................ | 323/266 |
| 6,201,764 B1 | * 3/2001 | Warita et al. ................ | 361/18 |
| 6,222,709 B1 | * 4/2001 | Baba ........................... | 361/18 |

\* cited by examiner

*Primary Examiner*—Peter S. Wong
*Assistant Examiner*—Lawrence Luk
(74) *Attorney, Agent, or Firm*—Finnegan, Henderson, Farabow, Garrett & Dunner, L.L.P.

(57) ABSTRACT

A power supply control unit of this invention has a stabilized power source by a DC/DC converter and a Zener diode for supplying selectively plural voltages and supplies a power to a current vibration type shut-off function provided switching circuit. When power supply from a power source to a low voltage load is controlled via switching by a temperature sensor incorporated FET, a reference voltage having a voltage characteristic equivalent to that of a voltage between terminals of the temperature sensor incorporated FET to which a predetermined load is connected is generated by a reference FET and a resistor. A difference between a voltage between the terminals of the temperature sensor incorporated FET and the reference voltage is detected by a comparator. Then, the ON/OFF of the temperature sensor incorporated FET is controlled depending on a difference between the voltage between the terminals and the reference voltage by a driving circuit.

21 Claims, 12 Drawing Sheets

US 6,335,577 B1

POWER SUPPLY CONTROL UNIT AND POWER SUPPLY CONTROL METHOD

BACKGROUND OF THE INVENTION

1. Field of the Invention

The present invention relates to a power supply control unit and a power supply control method, and more particularly to a power supply control unit having a semiconductor switch for controlling a power supply from a power source to a load by switching control depending on a control signal.

2. Description of the Related Art

FIG. 1 shows a conventional power supply control unit having a semiconductor switch. This conventional power supply control unit supplies a power from a battery to each load selectively and controls the power supply to the load.

In this conventional power supply control unit shown in the same Figure, a shunt resistor RS and a drain D and source S of a thermal FET QF are connected in series in a path for supplying an output voltage VB of a power source 101 to a load 102 such as a head lamp and a power window driving motor. Further, this power supply control unit comprises a driver 901 for detecting a current flowing in the shunt resistor RS so as to control a driving of the thermal PET QF by a hardware circuit , an A/D converter 902 for carrying out ON/OFF control of a driving signal of the thermal FET QF based on a current value monitored by a driver 901, a microcomputer (CPU) 903. The thermal FET QF acting as a semiconductor switch contains an over-heat shut-off function for turning itself OFF by an incorporated gate shut-off circuit when an incorporated temperature sensor (not shown) detects that a temperature of the thermal FET QF rises up to a temperature above a predetermined one. A symbol RG in the same FIG. indicates an incorporated resistor and ZD1 denotes a Zener diode which maintains 12 V between gate G and source S and bypasses when an overvoltage is about to be applied to the gate G.

Further, this conventional power supply control unit also includes a protective function for an overcurrent on the load 102 or between the drain D and source S of the thermal FET. Namely, the driver 901 comprises differential amplifiers 911, 913 as a current monitor circuit, a differential amplifier 912 as a current control circuit, a charge pump circuit 915 and a driving circuit 914 for driving the gate G of the thermal FET QF via an internal resistor RG based on an ON/OFF control signal from the microcomputer 903 and a result of overcurrent determination from a current control circuit.

When a voltage different from the output voltage VB of the power source 101 is used, for example, VB is 42 V while the other necessary voltage is 12V, it is necessary to provide a new power supply control unit including the aforementioned charge pump 915. By providing the power supply control unit for 12 V, 12 V can be obtained as well as 42 V.

When an overcurrent is detected via the differential amplifier 912 based on a voltage drop in the shunt resistor RS by determining that the currant exceeds its predetermined (upper limit) value, the thermal FET QF is turned OFF by the driving circuit 914 and when the current drops below a predetermined (lower limit) value, the thermal FET is turned ON.

On the other hand, the microcomputer 903 always monitors a current via current monitor circuits (differential amplifiers 911, 913). When an abnormal current exceeding a normal value flows, it turns OFF the thermal FET QF by turning OFF a driving signal to the thermal FET QF. When the temperature of the thermal FET QF exceeds its predetermined value before the driving signal for OFF control is outputted from the microcomputer 903, the operation of the thermal FET QF is turned OFF by the overheat shut-off function.

However, in the above-mentioned conventional power supply control unit, a charge pump is necessary for that control. Because generally, the charge pump circuit is large in size, reduction of the size of the charge pump and its production cost are difficult.

Further, when the charge pump is necessary, the total number of components of the power supply control unit increases and the circuit thereof becomes complicated. Thus, a reliability of such a power supply control unit is not so satisfactory.

Further, to detect a current, a shunt resistor RS connected to a power supply path in series is necessary. Because, in recent years, current flowing to the load has been increased with a reduction of ON resistance of the thermal FET QF, heat loss of the shunt resistor cannot be neglected.

Although the aforementioned overheat shut-off function and overcurrent limiting circuit function when a substantially complete short-circuit occurs in the load 102 and wiring so that a large current flows, they do not function when a rare short-circuit such as incomplete short-circuit having some extent of short-circuit resistance occurs so that a small short-circuit current flows. Therefore, there is no way but turning OFF the thermal FET QF by detecting an abnormal current by a microcomputer 903 via a current monitor circuit. However, according to the conventional art, a response of microcomputer control to the abnormal current is not satisfactory.

Further, because the shunt resistor RS. A/D converter 902, microcomputer 903 and the like are necessary, a large installation space is necessary. Thus, there is a problem that the cost for the unit is increased by these relatively expensive components.

SUMMARY OF THE INVENTION

The present invention has been achieved to solve the above described conventional problems and therefore, an object of the invention is to provide a power supply control unit having a simple circuit structure and a high reliability in which a charge pump circuit can be eliminated, Another object of the invention is to provide a power supply control unit and power supply control method in which a shunt resistor connected to a power supply path for detecting a current in series is unnecessary so as to suppress heat loss and a quick response is enabled against an abnormal current generated when a rare short-circuit such as incomplete short-circuit having some extent of short-circuit resistance occurs, the power supply control unit being easy to integrate and not expensive.

To achieve the above object, there is provided a power supply control unit comprising: a power transmission means for supplying a power from a power source to a first load; an auxiliary power means for generating at least a kind of voltage different from a voltage of the power source; a semiconductor switch for controlling a power supply to a second load from the auxiliary power means by switching control depending on a control signal supplied to a control signal input terminal thereof; a reference voltage generating means for generating a reference voltage having a voltage characteristic equivalent to the voltage characteristic of a voltage between terminals of the semiconductor switch when a predetermined load is connected thereto; a detecting means for detecting a difference between a voltage between the terminals of the semiconductor switch and the reference voltage: a control means for controlling ON/OFF of the semiconductor switch depending on a difference between the detected voltage between the terminals and the reference voltage; and a control reference voltage supply means for supplying a voltage serving for a reference of control to the control means.

According to the present invention, an electric power is supplied to both the first load requiring a predetermined voltage of a power source and a second load requiring a voltage different from the predetermined voltage. The power supply to the second load is carried out through a current vibration type shut-off function provided switching circuit. As a result, an abnormal current such as a rare short-circuit, ordinary short-circuit and excessive current can be detected by monitoring current. When the abnormal current is detected, the power supply can be Interrupted.

According to a preferred embodiment of the present invention, the reference voltage generating means comprises a circuit which is connected in parallel to the semiconductor switch and the second load and in which a second semiconductor switch controlled by switching depending on the control signal and a third load are connected in series, said reference voltage generating means generating a voltage between terminals of the second semiconductor switch as the reference voltage.

According to another preferred embodiment of the present invention, the voltage characteristic possessed by the reference voltage of the reference voltage generating means is equivalent to the voltage characteristic In a condition that a target current which is maximum current in normal operating range flows to the semiconductor switch and the second load.

According to still another preferred embodiment of the present invention, the semiconductor switch and the second semiconductor switch have equivalent characteristic with respect to a transient voltage characteristic of a voltage between the terminals at the time of change from OFF state to ON state.

According to the above described embodiments, the necessity of the conventional shunt resistor is eliminated so as to suppress heat loss. Further, not only an overcurrent due to complete short-circuit but also an abnormal current generated when a rare short-circuit such as Incomplete short-circuit having some extent of short-circuit resistance can be detected continuously by a hardware circuit or programming on microcomputer. Specifically when the ON/OFF control of the semiconductor switch is achieved by a hardware circuit, the microcomputer is also unnecessary. Therefore, the installation space can be reduced and the production cost of the power supply unit can be reduced largely.

According to a further preferred embodiment of the present invention, a current capacity of the second semiconductor switch is smaller than the current capacity of the semiconductor switch and a ratio of resistance between the second load and the third load is equivalent to a ratio of the current capably between the semiconductor switch and the second semiconductor switch.

According to this embodiment, the circuit structure of the reference voltage generating means having the second semiconductor switch and the third load can be reduced in size, so that the installation space can be reduced and the cost on the power supply control unit can be also reduced.

According to a further preferred embodiment of the present invention, the third load has plural resistors and a resistance of the third load is changed and set by connecting selectively any one of the plural resistors.

According to a further preferred embodiment of the present invention, the aforementioned power supply control unit further comprises a variable resistor connected to the second load in series or connected to the third load in parallel wherein a resistance of the third load is changed and set by the variable resistor.

According to the above two embodiments, plural specifications can be covered by a single kind of the chip. Complete short-circuit and incomplete short-circuit can be detected separately depending on the type of the load securely, so that protection against short-circuit fault can be carried out accurately.

According to a further preferred embodiment of the present invention, the control means turns OFF the semiconductor switch when a difference between a detected voltage between the terminals and the reference voltage exceeds a first threshold value and turns ON the semiconductor switch when a difference between the detected voltage between the terminals and the reference voltage drops below a second threshold value.

According to a further preferred embodiment of the present invention, the aforementioned power supply control unit further comprises an overheat protecting means for protecting the semiconductor switch by OFF control when the semiconductor switch is overheated.

According to this embodiment, when an incomplete short-circuit having some extent of short-circuit resistance occurs, the ON/OFF of the semiconductor switch is repeated by the control means so as to change current largely. The shut-down of the semiconductor switch by the overheat protecting means is accelerated by cyclic heat generation of the semiconductor switch, so that a quick response to abnormal current generated when the incomplete short-circuit occurs can be achieved.

According to a further preferred embodiment of the present invention, the semiconductor switch, the reference voltage generating means, the detecting means, the control means and the overheat protecting means are formed on a same chip.

According to this embodiment, the circuit structure of the power supply control unit can be reduced in size, so that the installation space can be reduced and the cost on the power supply control unit can be reduced and further, an influence of temperature drift and deviation between lots can be eliminated.

According to a further preferred embodiment of the present invention, a cycle of ON/OFF control of the semiconductor switch by the control means is used as a control clock, According to this embodiment, an oscillation circuit dedicated for the control clock becomes unnecessary. Because the cycle of the ON/OFF control of the semiconductor switch (FET) is stabilized, a stabilized clock can be obtained as the control clock.

According to a further preferred embodiment of the present invention, the aforementioned power supply control unit further comprises an inhibit means for Inhibiting ON/OFF control of the semiconductor switch by the control means in a predetermined period after the semiconductor switch is turned to ON state.

According to this embodiment, overcurrent control which may occur when rush current flows upon a rise-up of the second load is Inhibited so as to suppress a delay of load response.

According to a further preferred embodiment of the present invention, the power supply control unit further comprises an overheat shut-off accelerating means for accelerating OFF control by the overheat protecting means during ON/OFF control of the semiconductor switch by the control means.

According to this embodiment, the shut-off of the semiconductor switch upon an incomplete short-circuit is accelerated so as to achieve a quick response.

According to a further preferred embodiment of the present invention, the power supply control unit further comprises a frequency control means for Integrating ON/OFF control frequency of the semiconductor switch by the control means and when the control frequency reaches a predetermined frequency, turning OFF the semiconductor switch.

According to this embodiment, a quick response can be achieved by accelerating the shut-off of the semiconductor switch even upon an incomplete short-circuit up to an arbitrarily set time.

Further, to achieve the above object, there is provided a power supply control method using a power supply control unit comprising: a power transmission means for supplying a power from a power source to a first load: an auxiliary power means for generating at least a kind of voltage different from a voltage of the power source; and a semiconductor switch for controlling a power supply to a second load from the auxiliary power means by switching control depending on a control signal supplied to a control signal input terminal thereof, the power supply control method comprising: a reference voltage generating step for generating a reference voltage having a voltage characteristic equivalent to the voltage characteristic of a voltage between terminals of the semiconductor switch when a predetermined load is connected thereto; a detecting step for detecting a difference between a voltage between the terminals of the semiconductor switch and the reference voltage; a control step for controlling ON/OFF of the semiconductor switch depending on a difference between the detected voltage between the terminals and the reference voltage; and a control reference voltage supply step for supplying a voltage serving for a reference of control to the control means.

According to a preferred embodiment of the present invention, in the reference voltage generating step, the voltage characteristic possessed by the reference voltage is equivalent to the voltage characteristic in a condition that a target current which is maximum current in normal operating range flows to the semiconductor switch and the second load.

According to another preferred embodiment of the present invention, the control step comprises an OFF control step for turning OFF the semiconductor switch when a difference between a detected voltage between the terminals and the reference voltage exceeds a first threshold value; and an ON control step for turning ON the semiconductor switch when the difference between the detected voltage between terminals and the reference voltage drops below a second threshold value.

According to still another preferred embodiment of the present invention, the power supply control method further comprises an overheat protecting step for protecting the semiconductor switch by OFF control when the semiconductor switch is overheated.

According to a further preferred embodiment of the present invention, the power supply control method further comprises an inhibit step for inhibiting ON/OFF control of the semiconductor switch by the control step in a predetermined period after the semiconductor switch is turned to ON state.

According to a further preferred embodiment of the present invention, the OFF control by the overheat protecting step is accelerated at the time of ON/OFF control of the semiconductor switch by the control step.

According to a further preferred embodiment of the present invention, the power supply control method further comprises a frequency control step for integrating ON/OFF control frequency of the semiconductor switch by the control step and when the control frequency reaches a predetermined frequency, turning OFF the semiconductor switch.

The nature, principle and utility of the invention will become more apparent from the following detailed description when read in conjunction with the accompanying drawings.

DESCRIPTION OF THE PREFERRED EMBODIMENTS

Hereinafter, the preferred embodiments of the power supply control unit and power supply control method will be described about a first embodiment, a second embodiment, a third embodiment, a fourth embodiment, a fifth embodiment and a modification in order with reference to FIGS. 2–13.

Although, in a following description, the power supply control unit and power supply control method will be described about, for example, an embodiment in which the present invention is applied to a power supply control unit which supplies an electric power selectively to a load such as a lamp of automobile and controls the power supply to the load, the invention in not restricted to any particular embodiment, however, the invention may be applied to any power supply control unit or power supply control method for controlling a power supply from the power source to the load by switching operation.

[First embodiment]

First, a power supply control unit according to the first embodiment of the present invention will be described with reference to FIG. 2.

Figure 1:
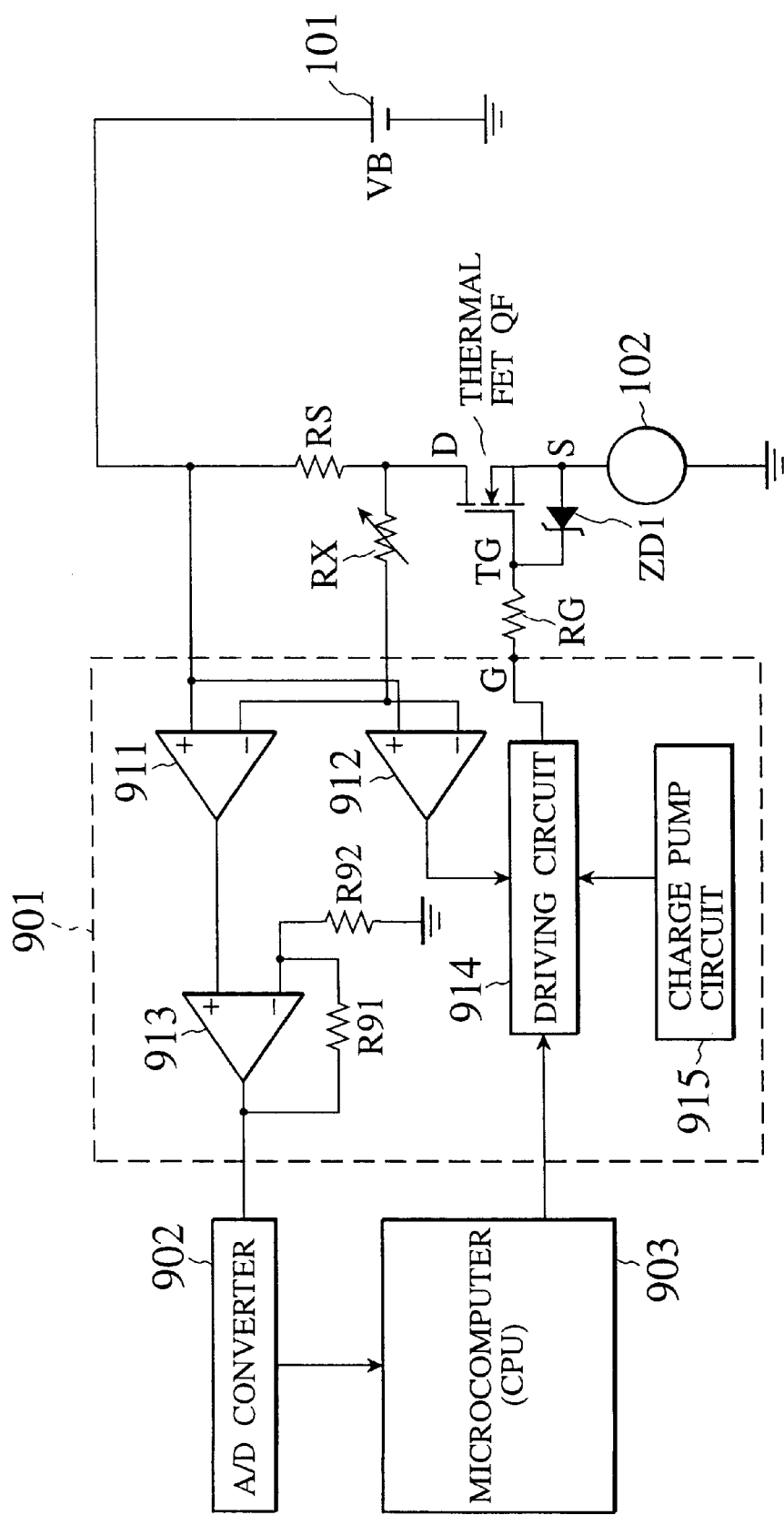
FIG. 1 is a circuit configuration diagram of a conventional power supply control unit having a semiconductor switch.
Figure 2:
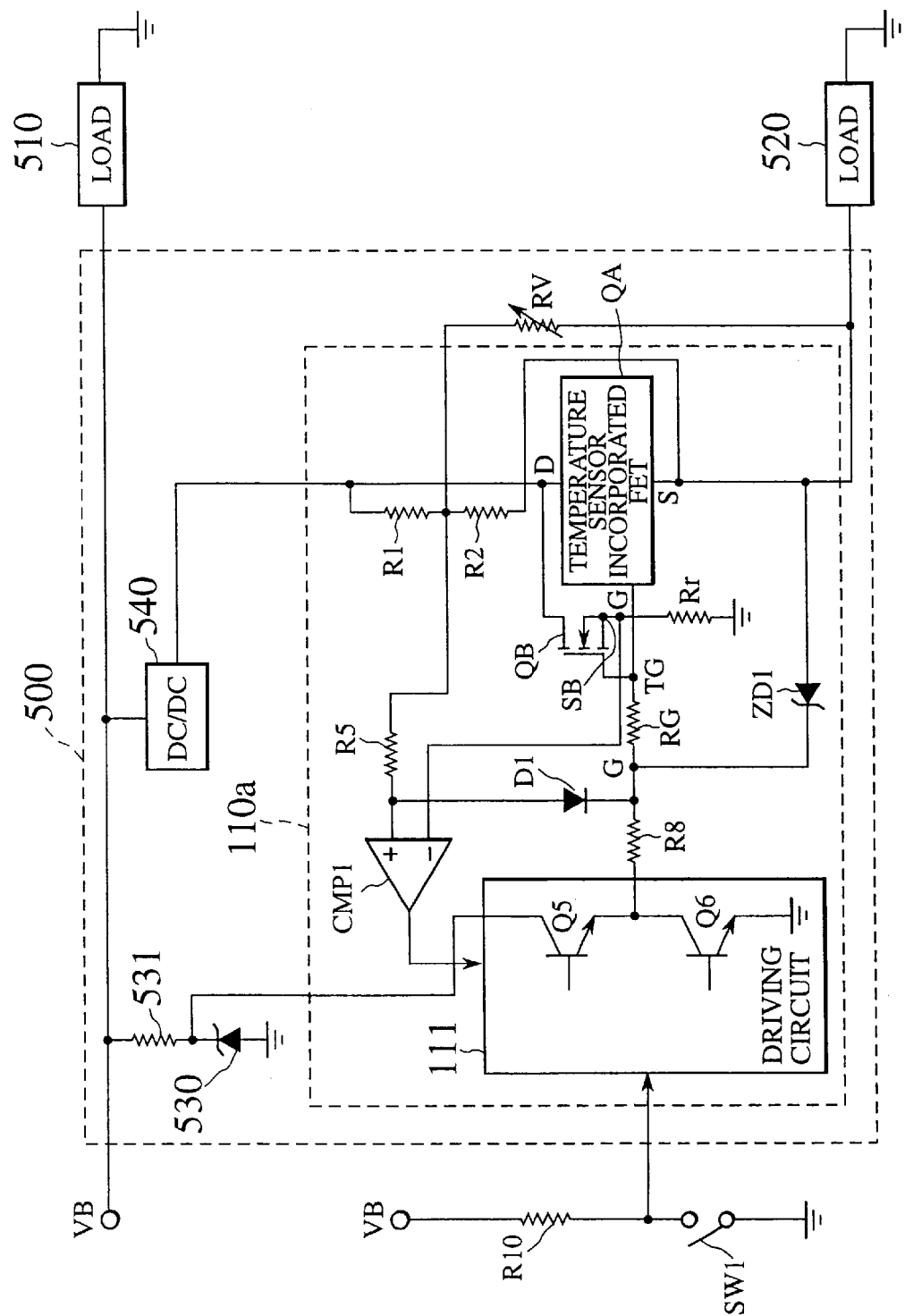
FIG. 2 is a circuit configuration diagram of a power supply control unit according to an embodiment of the present invention.

FIG. 2 shows an example in which power supply control is carried out using the power supply control unit of the present invention on a high side (between power source VB and a second load 520). The circuit shown in the same Figure is comprised of a circuit for supplying a power source voltage VB to a first load 510 and a circuit for supplying the power supply voltage VB to a driving circuit 111 and a DC/DC converter 540.

In recent years, a trial for raising the power supply voltage of automobile from a conventional value to higher values has been made. For example, instead of the conventional power supply voltage of 12 V, a power source system having as high a voltage as 42 V has been employed gradually. This intends to raise an operating efficiency of a rotation apparatus such as a air conditioner and blower fan by increasing the voltage supplied thereto. Further, because quantity of current flow may be reduced by increasing the voltage, it is possible to replace automobile wire harness with one having a smaller size than the conventional type. As a result, the entire weight of automobile can be reduced and energy saving can be also achieved.

Because most electronic parts used in various control units of automobile are produced on an assumption of lowvoltage operation, a conventional power source as low as 12 V In also necessary at the same time while a higher voltage system has been achieved.

In the circuit diagram shown in FIG. 2, the power supply voltage VB is supplied to a first load 510 as it is to satisfy the above-mentioned demand, for example, a voltage as high as 42 V is supplied. On the other hand, the power is supplied to a second load 520 through a current vibration type shut-off function provided switching circuit 500. The voltage of this supplied power is as low as 12 V and used for computer for controlling control units of automobile.

To produce such a low voltage, this switching circuit lowers the power supply voltage of, for example, 42 V up to 12 V using a DC/DC converter 540. A voltage of 12 V produced in this manner is supplied to the second load 520 through a temperature sensor incorporated FEI QA. The temperature sensor incorporated FET QA and its peripheral circuits will be described with reference to FIG. 3.

On the other hand, the power supply voltage VB is lowered by a Zener diode 530 and that voltage is supplied to a driving circuit 111. When the power is supplied to this driving circuit 111, the aforementioned temperature sensor incorporated FET QA is controlled. A current limit resistor 531 prevents a generation of an excessive current which may occur when an equivalent resistance on the side of the driving circuit 111 is nearly open. Operation/non-operation of the driving circuit 111 is controlled by opening/closing SW1 and accordingly, the power supply to the second load 520 is controlled.

The power supply control unit according to the above-mentioned embodiment of the present invention will be described about its circuit and operation control in detail as follows.

Figure 3:
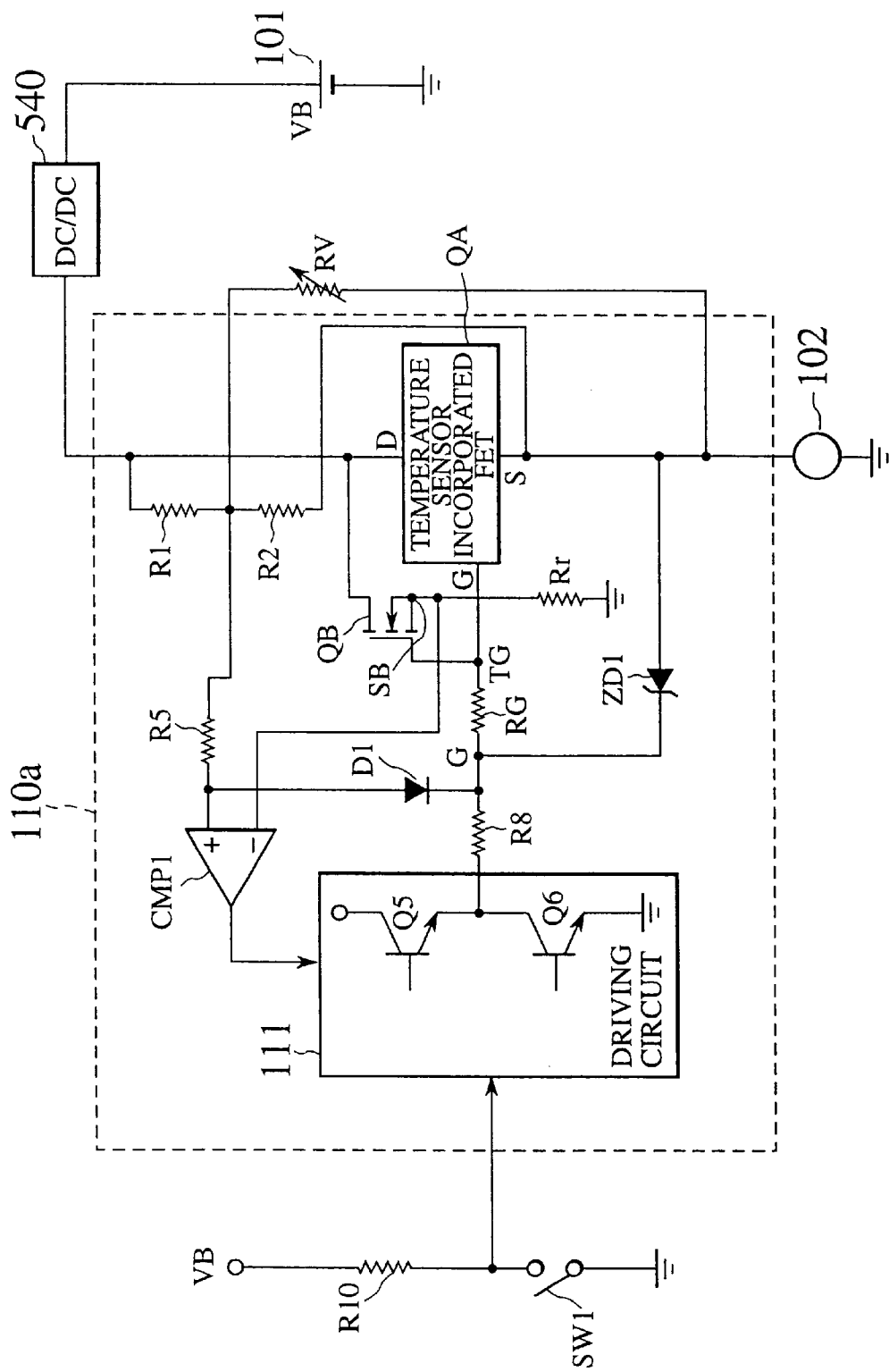
FIG. 3 is a circuit configuration diagram of a power supply control unit according to a first embodiment of the present invention.

Referring to FIG. 3, the power supply control unit of this embodiment is so constructed that drain D and source S of the temperature sensor incorporated FET QA which is a semiconductor switch are connected in series to a path for supplying an output voltage VB of the power source 101 to the load 102. Although type NMOS having DMOS structure is used as the temperature sensor Incorporated FET QA, type PMOS may be used.

In the same Figure, a portion for controlling the driving of the temperature sensor incorporated FET QA includes FET QB, resistors R1–R10, Zener diode ZD1, diode D1, comparator CMP1, driving circuit 111, and switch SW1. Although "R" and numeral following it are used for a resistor as reference numeral, not only they are used as the reference numeral but also indicate a resistance of a given resistor. A portion indicated by reference numeral 110a surrounded by dot line of FIG. 3 indicates a chip portion to be analog-integrated.

Reference numeral 102 denotes, for example, a head lamp, a driving motor of power window or the like, which is actuated when user turns ON the switch SW1. A driving circuit 111 is so constructed that a source transistor Q5 whose collector side is connected to potential VP and a sync transistor Q6 whose emitter side is connected to grounding potential (GND) are connected in series. Based on a selection signal produced by turning ON/OFF the switch SW1, the source transistor Q5 and sync transistor Q6 are turned ON/OFF so as to output a signal for controlling the driving of the temperature sensor incorporated FET QA. In the same Figure, symbol VB denotes an out put voltage of the power source 101, which is, for example, 42 V. Symbol VP denotes a terminal on which an output voltage from the Zener diode 530 is applied, for example, VB+22 V.

Figure 4:
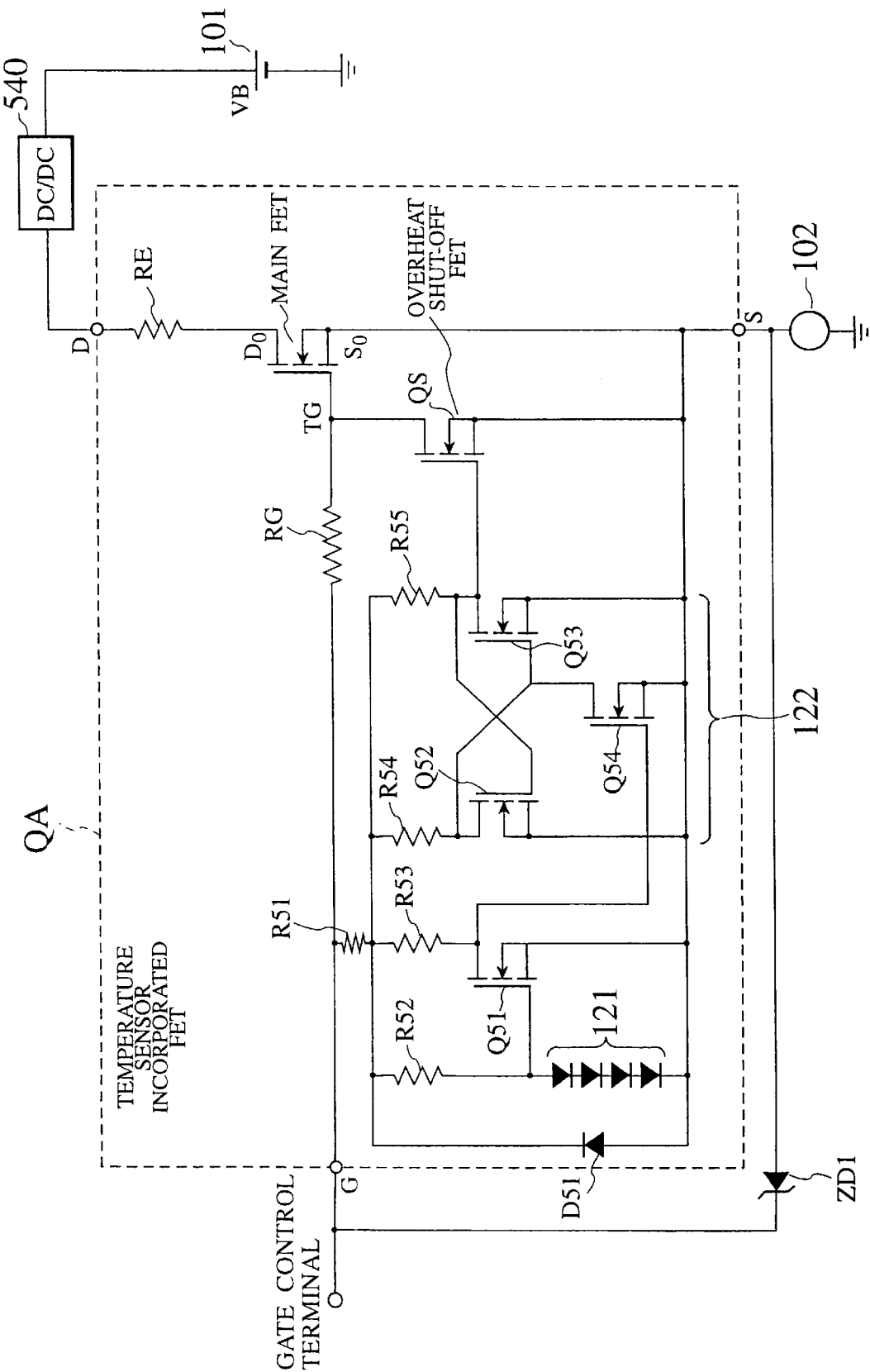
FIG. 4 is a detailed circuit configuration diagram of a semiconductor switch (temperature sensor incorporated FET) for use in the embodiment.

The temperature sensor incorporated FET QA as a semiconductor switch has a structure shown in FIG. 4.

Referring to FIG. 4, the temperature sensor incorporated FET QA comprises an incorporated resistor RG, a temperature sensor 121, a latch circuit 122 and an overheat shut-off FET QS. ZD1 denotes a Zener diode which maintains 12 V between gate G and source SA and bypasses when an overvoltage is about to be applied to the gate G.

When it is detected that the temperature of the temperature sensor incorporated FET QA rises to a temperature over a predetermined value by the temperature sensor 121, detection information about that is held by the latch circuit 122 and the overheat shut-off FET QS as a gate cut-off circuit is turned ON so that the temperature sensor incorporated FET is forced to be turned OFF.

The temperature sensor 121 is constructed by connecting four diodes in series. As the temperature of the temperature sensor incorporated FET QA rises, a resistance of each diode of the temperature sensor 121 decreases. Thus, when gate potential of FET Q51 drops to potential of "L" level, the FET Q51 turns from ON state to OFF state. As a result, the gate potential of the FET Q54 is pulled up to a potential of a gate control terminal (G) of the temperature sensor incorporated FET QA so that the FET Q54 turns from OFF state to ON state. As a result, "1" is latched by the latch circuit 122. At this time, the output of the latch circuit 122 becomes "H" level so that the overheat shut-off FET OS turns from OFF state to ON state. Thus, a real gate (TG) of the temperature sensor incorporated FET QA become the "L" level, so that the temperature sensor incorporated FET QA turns from ON state to OFF state thereby shutting off overheat.

Further, the power supply control unit of this embodiment also has a protective function for an overcurrent due to a short-circuit fault which may occur in the load 102 or between drain D and source S of the temperature sensor Incorporated FET QA or abnormal current due to incomplete short-circuit fault.

Hereinafter, a structure for achieving this protective function will be described with reference to FIG. 3.

First, the reference voltage generating means described in claims comprises FET (second semiconductor switch) QB and resistor (third load) Rr. A drain and gate of FET QB are connected to a drain (D) and gate (TG) of the temperature sensor incorporated FET QA respectively. A source (SB)of the FET QB is connected to a terminal of the resistor Rr and the other terminal of the resistor Rr is connected to grounding potential. By making common the drains (D) and gates (TG) of the FET QB and temperature sensor incorporated FET QA, Integration to the same chip (110a) can be facilitated.

Further, by using the FET QB and temperature sensor incorporated FET QA formed on the same chip (110a) by the same process, it is intended to remove (reduce) an influence of temperature drift and deviation of the quality between lots. Further, to make current capacities of the FET QB and FET QC smaller than the current capacity of the temperature sensor incorporated FET QA, transistors connected In parallel for composing the respective FETs are so constructed that (number of the transistors of the FET QB:1)<(number of transistors of the temperature sensor incorporated FET QA:1000).

A resistance of the resistor Rr is set to be a resistance of the load 102×(number of transistors of the FET QB: 1/number of transistors of the temperature sensor incorporated FET QA: 1000). By setting this resistor Rr, the same voltage $V_{DS}$ between drain and source as when a normal operation load current (5 mA) flows to the temperature sensor incorporated FET QA can be generated in the FET QB. By specifying the circuit in the above way, the structure of the reference voltage generating means comprised of the FET QB and resistor Rr can be minimized so as to reduce the installation space thereby production cost being reduced.

A variable resistor RV is disposed out of the chip and connected in parallel to a resistor R2. By changing the resistance of the variable resistor RV, the resistance of the resistor R2 is changed and set to an equivalent value. That is, the resistors R1, R2, RV are the same as a voltage dividing means for dividing the voltage VDA between drain and source of the temperature sensor incorporated FET QA at a dividing ratio based on a resistance ratio thereof and supplying the divided voltages to the comparator CMP 1. The voltage dividing ratio is adjusted by setting the resistor RV. As a result, it is possible to change a threshold of the voltage $V_{DS}$ between drain and source for switching an output of the comparator CMP 1 from "H" level to "L" level with respect to a set value (reference) fixed in the reference voltage generating means. Consequently, despite analog-integration, a single chip 110a is capable of covering plural specifications of the unit.

The comparator CMP1 forms part of a detecting means, which is called in claims. A voltage obtained by dividing the voltage $V_{DS}$ between drain D and source S of the temperature sensor incorporated FET QA by the resistor R1. resistor R2 and parallel resistance of the variable resistor RV (R2 μRV) is supplied to 37 +" input terminal of the comparator CMP 1 via a resistor R5. A source voltage $V_s$ of the FET QB is supplied to "−" input terminal of the comparator CMP 1. That is, when potentials supplied to both input terminals of the "+" and "−" substantially coincide with each other, the output is made valid ("H" level). Otherwise, the output is made invalid ("L" level). As described later, the comparator CMP 1 has a predetermined hysteresis.

Figure 5:
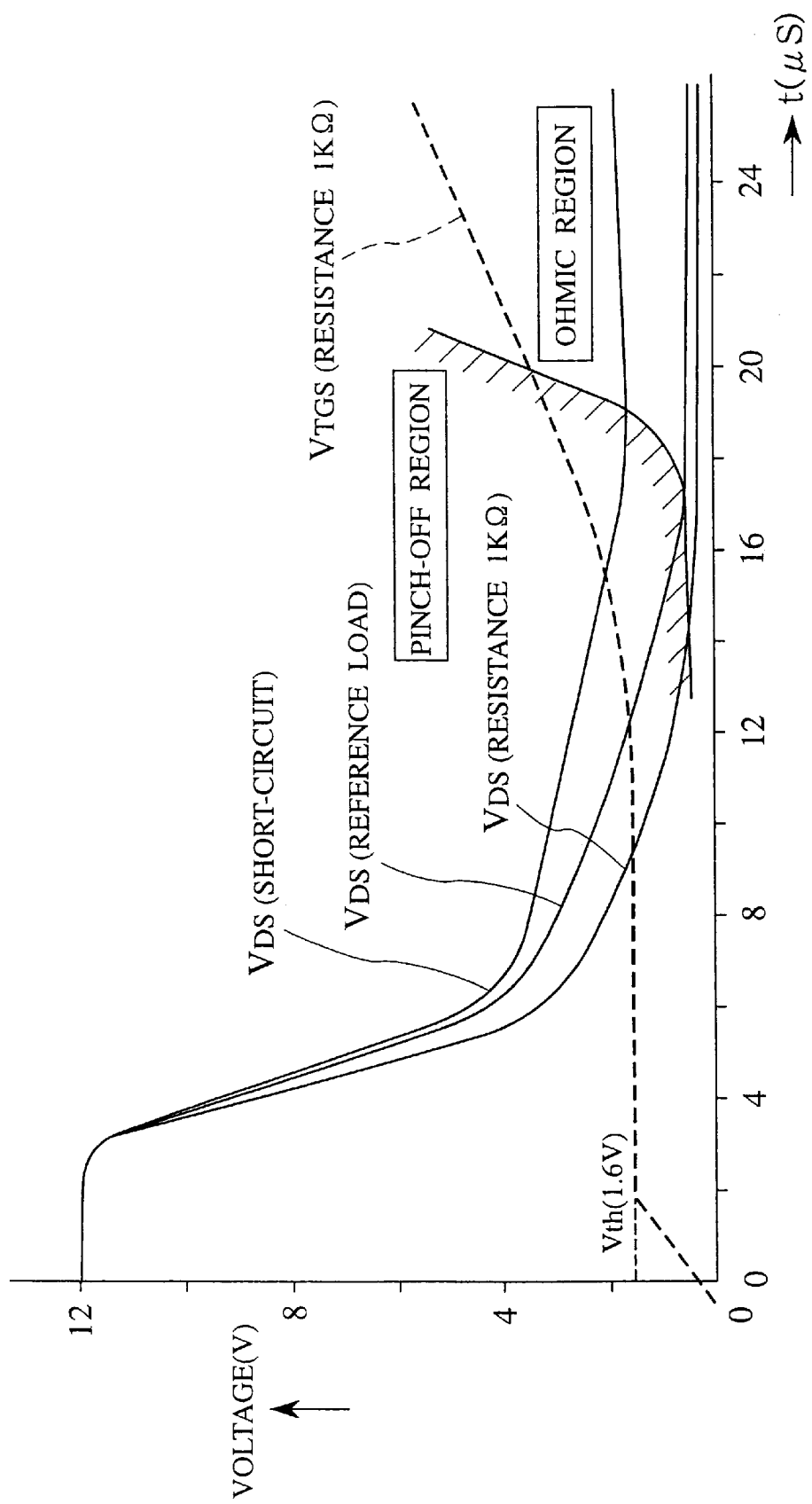
FIG. 5 is an explanatory diagram (No. 1) for explaining a principle for use In the power supply control unit and power supply control method of the embodiment a indicating a rise-up characteristic of a voltage between drain and source at the time of transition from OFF state to ON state.

Next, the power supply control method will be described based on a circuit structure of the power supply control unit of this embodiment Prior to concrete description of operation thereof, a principle used by the power supply control unit and power supply control method of this embodiment will be described with reference to FIGS. 5, 6 and 7. FIG. 5 is an explanatory diagram of fall characteristic of voltage between drain and source at the time of a change from OFF state to ON state, FIG. 6 is a conceptual circuit diagram and FIG. 7 is an explanatory diagram for explaining the characteristic of drain current in the temperature sensor incorporated FET and the characteristic of the voltage between date and source.

Figure 6:
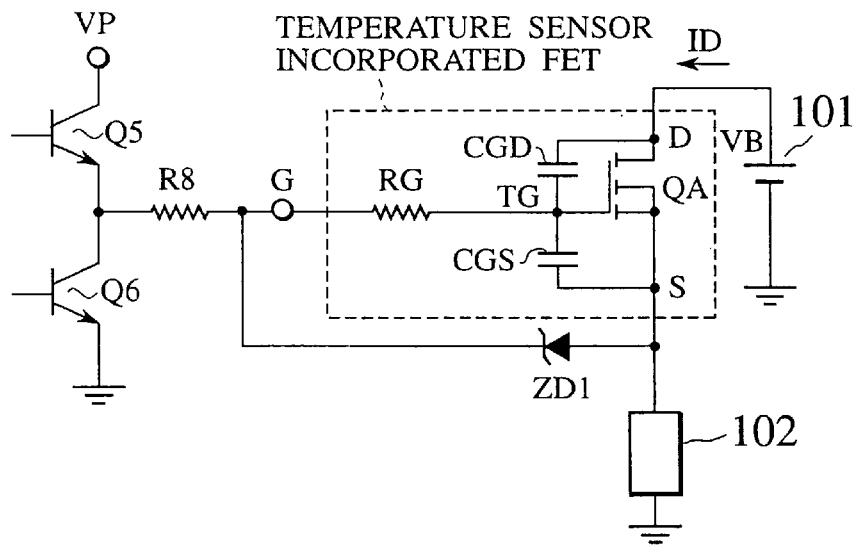
FIG. 6 is an explanatory diagram (No. 2) for explaining a principle for use in the power supply control unit and power supply control method of the embodiment or a conceptual circuit diagram.
Figure 7:
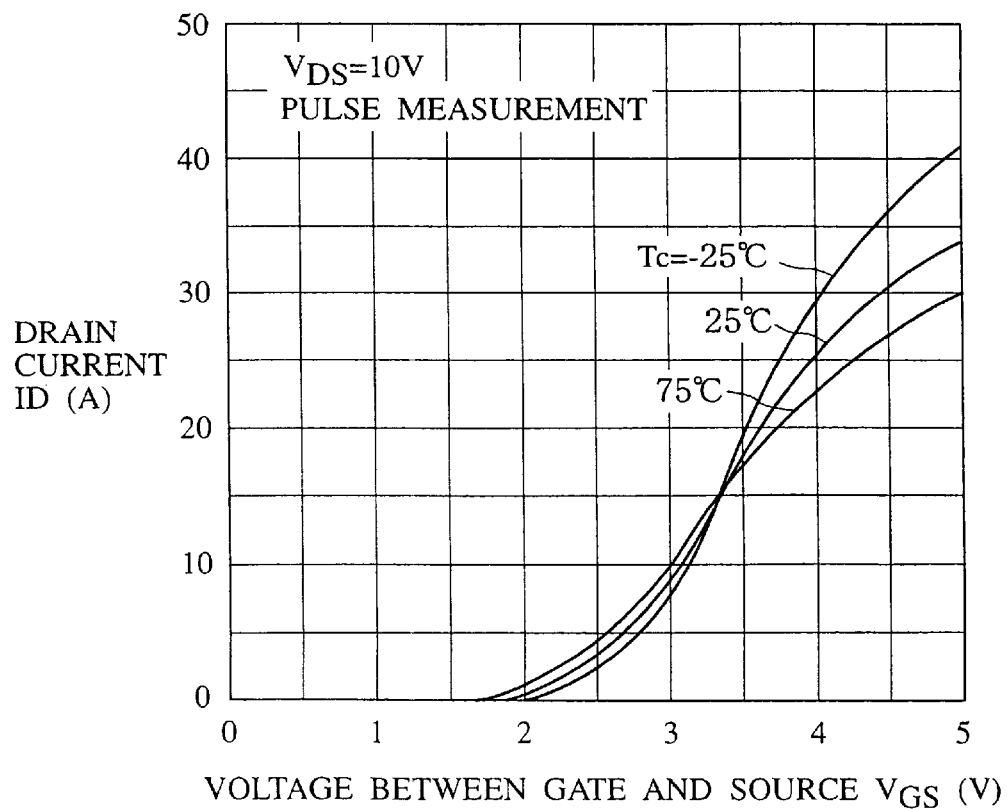
FIG. 7 is an explanatory diagram (No. 3) for explaining a principle for use in the power supply control unit and power supply control method of the embodiment or an explanatory diagram for explaining characteristics of a drain current and a voltage between drain and source in the temperature sensor incorporated FET.

When the temperature sensor incorporated FET QA is used as a semiconductor switch, a power supply path from the power source 101 to the load 102 is schematically represented as a circuit shown In FIG. 6. The load 102 includes wiring inductance LO and wiring resistance R0 of power supply path. When a short-circuit fault occurs in the path or load 102, short-circuit resistance is included in the R0. Assuming that the load 102 is a head lamp in automobile to which this embodiment is applied, the short-circuit resistance is below 40 mΩ in case of complete short-circuit (dead short-circuit), and about 40–500 mΩ in came of incomplete shut-circuit.

The voltage $V_{DS}$ between drain and source of the temperature sensor incorporated FET QA which is part of such power supply path is shown in FIG. 5 as the characteristic of fall voltage when the temperature sensor incorporated FET QA turns from OFF state to ON state. That is, the characteristics of the fall voltages shown here are the characteristics indicated when a short-circuit occurs or the reference load (normal operation) is applied or the load 102 has a resistance of 1 KΩ. The fall characteristic changes depending on the power supply path and load state, namely, wiring inductance possessed by the path and time constant based on wiring resistance and short-circuit resistance.

Although, as a method for detecting an overcurrent using a change in the characteristic of voltage $V_{DS}$ between drain and source, a method for detecting an overcurrent by comparing with a predetermined threshold at a predetermined timing can be considered, a capacitor, plural resistors and the like are necessary to form a means for specifying the predetermined timing and the comparing means for comparing with the predetermined threshold. Then, when the quality of these components deviates, a detection error may occur. Further, the capacitor is necessary and because the capacitor cannot be loaded on a chip, an external installation part is needed, thereby leading to increase of production cost, Referring to FIG. 5, the temperature sensor incorporated FET QA is operated in the pinch-off region until the temperature sensor incorporated FET QA is turned ON so that the voltage $V_{DS}$ between drain and source is saturated.

A change In the voltage $V_{DS}$ between drain and source when the resistance of the load 102 is 1 KΩ can be considered as follows. Namely, first, when HITACHI "HAF2001" is used as the temperature sensor incorporated FET QA, the voltage $V_{TGS}$ between gate and source is maintained substantially at a threshold voltage of 1.6 V because drain current ID is 12 mA. Second, although the voltage $V_{TGS}$ between gate and source rises because charging to the gate (G) by the driving circuit 111 is continued, the voltage $V_{DS}$ between drain and source drops so that electric charge of capacity $C_{GD}$ between gate and drain is discharged. Thus, electric charge which reaches the voltage $V_{TGS}$ between gate and drain is absorbed. That is, the voltage $V_{DS}$ between drain and source drops at such a speed that electric discharge is generated from capacity $C_{GD}$ between gate and drain such that the electric charge reaching the voltage $V_{TGS}$ between gate and source generates no rise in potential. As a result, the voltage $V_{TGS}$ between gate and source is maintained at about 1.6 V.

Further, the change in the voltage $V_{DS}$ between drain and source when the load resistance is 1 KΩ can be also interpreted as follows. That is, this indicates a value of the voltage $V_{DS}$ between drain and source for maintaining the voltage $V_{TGS}$ of a real gate (TG) by absorbing electric charge sent to the gate (G) by the driving circuit 111 at respective transition points after the temperature sensor incorporated FET QA is turned to ON state. Thus, when the voltage $V_{DS}$ between drain and source after some time passes is above a curve when the load resistance is 1 KΩ in FIG. 5. it means that the voltage $V_{TGS}$ between gate and source is higher than 1.6 V. Meanwhile, the voltage $V_{DS}$ between drain and source never comes below the curve indicated when the load resistance is 1 KΩ.

Further, assuming that a distance from a curve when the load resistance is 1 KΩ in FIG. 5 is $\Delta V_{DSGAP}$, when electric charge of $\Delta V_{DSGAP} \times C_{GD}$ is subtracted from the voltage $V_{TGS}$ between gate and source, It means that the voltage $V_{TGS}$ between gate and source is 1.6 V. In other words, it means that the voltage $V_{TGS}$ between gate and source has risen by an amount corresponding to this electric charge from 1.6 V. When this condition is expressed, it can be expressed in a following equation.

$$V_{TGS} - 1.6 = \Delta V_{DSGAP} \times 2C_{GD}/(C_{GS} \times 2C_{GD})$$

That is, $\Delta V_{DSGAP}$ is parallel to (voltage $V_{TGS}$ between gate and source—1.6 V).

There is a substantially proportional relationship of 1 to 1 between the voltage Vys between gate and source and drain current ID as shown by the characteristic of FIG. 7. Here, the characteristic of FIG. 7 is that of HITACHI "HAF2001" and $V_{GS}$ in the Figure corresponds to the voltage $V_{TGS}$ between gate and source. Therefore, the $\Delta V_{DSGAP}$ is capable of expressing the drain current ID based on a corresponding relation shown in the characteristic of FIG. 7. In FIG. 7, resolution in the vicinity of drain current ID=10 A is about 80 mV/A. That is, drain current ID of 1 A corresponds to the voltage $V_{TGS}$ between gate and source of 80 mV. A change in drain current ID of ±5 A corresponds to a change in the voltage $V_{TGS}$ between gate and source of ±0.4 V. Meanwhile, this resolution corresponds to a resolution of a shunt resistor RS of 80 m Ω in the conventional example.

Although when the drain current ID is zero, the curve of the voltage VDS between drain and source is determined by only a circuit for charging the gate and mirror capacity, when the drain current ID flows, inductance Lc of the circuit and resistance Rc of the entire circuit make influences. Although the curve of the voltage VDB between drain and source rises as the drain current ID increases, when the drain current ID increases like a complete short-circuit (dead short-circuit). rise-up gradient of the drain current ID converges to a constant value determined by a charging speed of a circuit which charges the gate. Therefore, the curve of the voltage. $V_{TGS}$ between gate and source also converges.

There is a singular point in the characteristic shown in FIG. 7. In case of HITACHI "HAF2001", that point exists near a point in which the drain current ID is 15 A and the voltage $V_{TGS}$ between gate and source is 3.3–3.4 V. Because usually, normal load current is substantially below 15 A, it comes below the singular point. In this lower region, the voltage $V_{TGS}$ between gate and source decreases with an increase of the temperature with respect to the same drain current ID. Therefore, the frequency of error operation decreases even under high temperatures, which is an advantageous point.

When the circuit for charging the gate is different, the curve of the voltage $V_{DS}$ between drain and source against the same load current changes. Thus, the gate charging current always needs to be maintained in the same condition. When the gate charging current is decreased, the curve of the voltage $V_{DS}$ s between drain and source is shifted upward. When the voltage $V_{DS}$ between drain and source is increased with respect to the same drain current ID using this character, the overheat shut-off by the overheat shut-off protective function can be accelerated. The overheat shut-off acceleration circuit which will be described later uses this phenomenon.

Next, the operation of the power supply control unit of this embodiment will be described based on the above consideration. First, a reference voltage generating means (FET QB, resistor Rr) will be described. The temperature sensor incorporated FET QA and FET QB form a current mirror circuit of 100:1. When the source potentials of both are equal, the drain current $ID_{QB}$ is 1000×drain current $ID_{QB}$.

Therefore, when the drain current $ID_{QA}$ of 5 A in the temperature sensor incorporated FET QA and drain current $ID_Q B$ in the reference FET QB flow, the voltage $V_{DS}$ between drain and source coincides with the voltage $V_{TGS}$ between gate and source in each of the temperature sensor Incorporated FET QA and reference FET QB. That is, $V_{DSA}=V_{DSB}$ and $V_{TGSA}=V_{TGSB}$. Here, $V_{DSA}$ and $V_{DSB}$ are voltages between drain and source of the temperature sensor incorporated FET QA respectively, and $V_{TGSA}$ and $V_{TGSB}$ are voltages between gate and source of the temperature sensor incorporated FET QA and FET QB respectively.

Therefore, because a substantial power voltage VB is applied to both ends of the resistor Rr when the FET QB is completely turned to ON state, the resistance of the resistor Rr is determined as Rr=11.7 V/10 mA=1.17 KΩ, as a load of the FET QB equivalent to the load of 5 A connected to the temperature sensor incorporated FET QA.

An described above, although a value (curve) of the voltage $V_{DS}$ between drain and source when the load currant of 5 A flows in the temperature sensor Incorporated FET QA is used as reference value, by forming a reference voltage generating means using a FET QB having a smaller transistor quantity ratio (=current capacity ratio) than the temperature sensor incorporated FET QA, the reference voltage generating means is further reduced in size thereby achieving a requested function with such small occupied area. Further, by forming the FET QB and temperature sensor incorporated FET QA on the same chip in the same process, a deviation between lots and an influence of temperature drift can be eliminated so as to improve detection accuracy largely.

Next, the operation of the pinch-off region will be described. When the temperature sensor incorporated FET QA is changed from OFF state to ON state, the drain current $ID_{QA}$ rises aiming at a final load current determined by the circuit resistance. Further, the voltage $V_{TGSA}$ between gate and source of the temperature sensor incorporated FET QA becomes a value determined by the drain current $ID_{QA}$ and also rises while being braked by a mirror effect of the capacitor $C_{GD}$ due to a reduction the voltage $V_{TSGB}$ between drain and source. Further, although the voltage $V_{TGSB}$ between gate and source of the FET QB continues to increase under a relation of the voltage $V_{TGSB}=V_{TGSA}$ between gate and source up to the drain current $ID_{QB}=5$ mA (corresponding to the drain current $ID_{QA}$ of 5 A), because the drain current $ID_{QB}$ becomes constant as 5 mA (constant in the pinch-off region) the voltage $V_{TGSB}$ between gate and source also becomes constant.

In case of HITACHI "FAF2002", the voltage $V_{TGSB}$ between gate and source becomes constant as about 2.7 V.

Further, because the voltage $V_{TGSA}$ between gate and source of the temperature sensor incorporated FET QA increases with an increase of the drain current $ID_{QA}$, the voltage between gate and source becomes $V_{TGSA} < V_{TGSA}$. Because of relations of $V_{DSA}=V_{TGSA}+V_{TGD}$, $V_{DSB}=V_{TGSB}=V_{TGD}$, it comes that $V_{DSA}-V_{DSB}=V_{TGSA}-V_{TGSB}$. Here, because a differential $V_{TGSA}-V_{TGSB}$ of voltage between gate and source expresses drain current $ID_{QA-5A}$, by detecting the differential between drain and source of $V_{DSA}-V_{DSB}$, the drain current $ID_{QA}$ 5 A can be obtained.

The voltage $V_{DSB}$ between gate and source of the FET QB is inputted directly into the comparator CMP1 and the voltage $V_{DSA}$ between drain and source of the temperature sensor incorporated FET QA is divided by resistors R1 and R2. That divided voltages (it is assumed that the variable resistance RV is not considered) are inputted into the comparator CMP1. That is, $V_{DSA} \times R1/(R1+R2) \ldots$ (1) is inputted into the comparator CMP. Although the voltage $V_{DSB}$ between drain and source is larger than (1) just after the temperature sensor incorporated FET QA is turned to ON state. (1) increases with an increase of the drain current $ID_{QA}$ of the temperature sensor incorporated FET QA and finally becomes larger than the voltage $V_{DSB}$ between drain and source of the FET QB. At this time, the output of the comparator CMP1 changes from "H" level to "L" level, so that the temperature sensor incorporated FET QA is turned to OFF state.

In the comparator CMP1, hysteresis is composed of the diode D1 and resistor R5. When the temperature sensor incorporated FET QA is changed to OFF state, the gate potential is grounded by the sync transistor Q6 of the driving circuit 111 so that a difference of potential between the cathode of the diode D1 and drain D of the temperature sensor incorporated FET QA becomes $V_{DSB}+0.7$ V (forward voltage of Zener diode ZD1). As a result, current flows in the order of resistor R1, resistor R5 and diode D1, so that the potential of the "+" input terminal of the comparator CMP1 drops further as compared to when the driving circuit 111 is turned ON. Therefore, the temperature sensor incorporated FET QA is maintained in the OFF state up to a difference $V_{DSA-V}DSB$ of the voltage between drain and source which is smaller than when it is turned to OFF state. After that, the temperature sensor incorporated FET QA is changed to ON state. Although there are various ways for attaching the hysteresis characteristic, this is an example thereof.

Assuming that the voltage $V_{DSA}$ between drain and source is a threshold when the temperature sensor incorporated FET QA is changed to OFF state, a following equation is established.

$$V_{DSAth}-V_{DSA}=R2/R1 \times V_{DSB} \text{ (at 5 mA)} \quad (2)$$

An overcurrent determining value is determined by the equation (2). To change the overcurrent determining value, the variable resistor RV connected in parallel to the resistor R2 grounded outside of the chip 110a is adjusted. By reducing the resistance of the variable resistor RV, the overcurrent determining value can be shifted downward.

Next, an operation in the ohmic region will be described. When the temperature sensor incorporated FET QA is turned to ON state with wiring In normal condition, the temperature sensor incorporated FET QA is continuously maintained in the ON state. As a result, the voltages $V_{DSA}$, $V_{TGSB}$ between drain and source arrive near 10 V, so that the temperature sensor incorporated FET QA, QB are operated in the ohmic region.

No relation of 1:1 exists between the voltage $V_{DS}$ between drain and source and drain current ID in this region. In case of HITACHI "FAF2001", because the ON resistance is $R_{DS}$(ON)=30 m$\Omega$ when the voltage $V_{DS}$ between drain and source is 10 V, following equations are established.

$$V_{DSB}=5 \text{ A} \times 30 \text{ m}\Omega=0.15 \text{ V}$$

$$V_{DSA}=ID_{QA} \times 30 \text{ m}\Omega$$

$$V_{DSA}-V_{DSB}=30 \text{ m}\Omega \times (ID_{QA}-5 \text{ A}) \quad (3)$$

when the drain current $ID_{QA}$ increases due to short-circuit or the like of wiring, a value of the equation (3) increases and when it exceeds an overcurrent determination value, the temperature sensor incorporated FET QA is turned to OFF state. After that, it is turned to the aforementioned pinch-off region. The temperature sensor incorporated FET QA repeats transition to ON state/OFF state and finally, reaches overheat shut-off. When the wiring is restored to normal condition before the overheat shut-off is reached (example of intermittent short-circuit fault), the temperature sensor incorporated FET QA maintains the ON state continuously and returns to the operation in the ohmic region.

Figure 8:
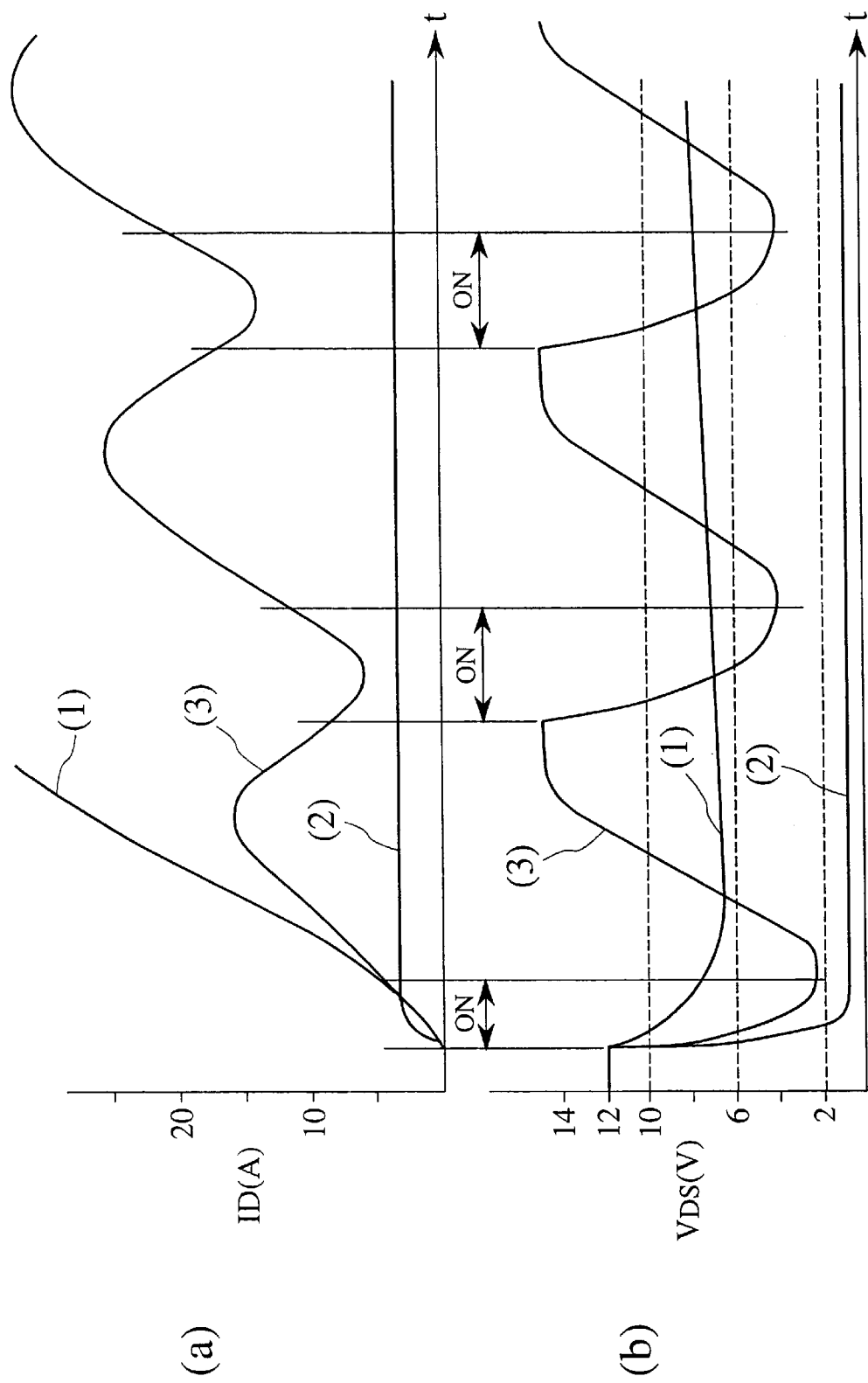
FIG. 8 is a waveform diagram for representing a current (a) and a voltage (b) in the semiconductor switch in the power supply control unit according to the embodiment at the times of a trouble due to short-circuit and normal operation.

FIG. 8 shows waveforms of current and voltage in the temperature sensor incorporated FET QA in the power supply control unit of this embodiment. FIG. 8 (a) indicates drain current ID (A) and FIG. 8(b) indicates voltage $V_{DS}$ between drain and source. In the same Figure, (1) indicates a complete short-circuit (dead short-circuit), (2) Indicates a case of normal operation and (3) indicates a case of incomplete short-circuit.

In case when the complete short-circuit (dead short-circuit)((1) of the same Figure) occurs, although the drain current ID flows rapidly when the temperature sensor incorporated FET CA is turned from OFF state to ON state, the ON state of the temperature sensor incorporated FET QA is continued so as to over-heat the temperature sensor incorporated FET QA. As a result, the over-beat shut-off protective function or the over-heat shut-off FETOS is changed to ON state, the temperature sensor incorporated FET QA IS over-heated.

When an incomplete short-circuit having some extent of short-circuit resistance occurs ((3) of FIG. 3), the ON/OFF control of the temperature sensor incorporated FET QA is repeated as described above so as to change the drain current ID largely. By frequent heat generation of the temperature sensor incorporated FET QA, the overheat shut-off protective function, namely, the overheat shut-off FET QA is turned to ON state so that overheat shut-off of the temperature sensor incorporated FET QA is accelerated.

As described above, the power supply control unit and power supply control method of this embodiment do not require a conventional shunt resistor connected directly to a power supply path for detecting current and are capable of detecting an overcurrent at a high precision without using the shunt resistor. As a result, heat loss in the entire unit can be suppressed. Not only an overcurrent due to complete short-circuit but also an abnormal current caused when such a rare short-circuit as incomplete short-circuit having some extent of short-circuit resistance can be detected continuously by a hardware circuit.

In case of incomplete short-circuit, the shut-off (OFF control) of the temperature sensor incorporated FET QA by the overheat protective function can be accelerated by oyclic heat generation of the semiconductor switch by repeating ON/OFF control of the temperature sensor incorporated FET QA so as to change current largely. Further, because the ON/OFF control of the semiconductor switch can be carried out by only the hardware circuit without using any microcomputer, the installation space of the power supply control unit can be reduced so as to reduce production cost of the unit largely.

When this embodiment is compared to the other method for detecting an overcurrent by comparing it with a predetermined threshold at a predetermined timing although a change in the characteristic of the voltage $V_{DS}$ between drain and source is used like this embodiment. Such components as capacitor and plural resistors are not necessary. Thus, detection error due to deviation of the quality of such components can be eliminated, and because any capacitor to be installed outside of the chip 110a is not necessary, the installation space and production cost of the unit can be reduced.

Further, by adjustment of the variable resistor RV, the complete short-circuit and incomplete short-circuit can be detected separately depending on the type (head lamp, driving motor or the like) securely so that protection against the short-circuit fault can be achieved at high precision.

[Second Embodiment]

Figure 9:
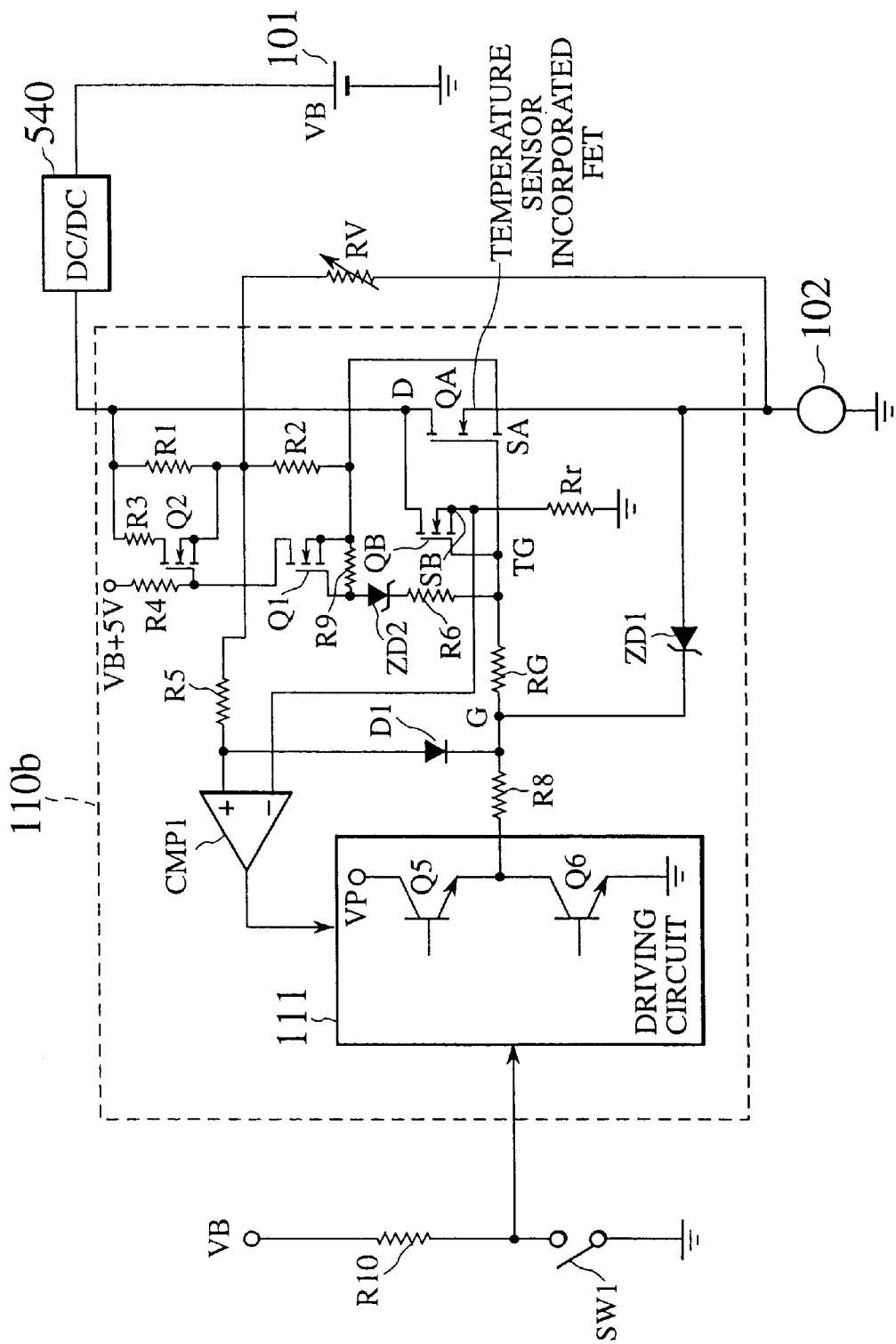
FIG. 9 is a circuit configuration diagram of a power supply control unit according to a second embodiment of the present invention.

The power supply control unit and power supply control method of the second embodiment will be described in detail with reference to FIG. 9. The power supply control unit of this embodiment is so that the resistors R3, R4, R6, R9, FET Q1, Q2 and Zener diode ZD2 are added to the structure of the first embodiment shown in FIG. 3. Meanwhile, a portion 110b surrounded by dot line of FIG. 9 indicates a chip portion to be analog-integrated.

That is, a real gate TG of the temperature sensor incorporated FET QA is connected to a gate of the FET Q1 in which gate and source are connected to each other by a resistor R9, through a Zener diode ZD2 and a resistor R6. A drain of the FET Q1 is connected to VB+5 V through a resistor R4 and a source of the FET Q1 is connected to a source SA of the temperature sensor incorporated FET QA. Further, a circuit in which the resistor R3 is connected to a drain of the FET Q2 is connected in parallel to the resistor R1 so as to change a divided voltage between drain and source of the temperature sensor incorporated FET QA by controlling ON/OFF of the FET Q2.

Next, an operation of the power supply control unit of this embodiment will be described. First, an operation of the pinch-off region will be described. Like the first embodiment, the voltage $V_{DSB}$ between drain and source of the FET QB is inputted directly into the comparator CMP. The voltage $V_{DSA}$ between drain and source of the temperature sensor incorporated FET QA is divided by parallel resistors (R1∥R3) composed of the resistors R1, R3 and resistor R2 and the divided voltage (it is assumed that the variable resistor RV is not considered) is inputted into the comparator CMP1.

That is, a value of the following formula is inputted to the comparator CMP1.

$$V_{DSA} \times (R1\|R3)/((R1\|R3)+R2) \quad (1^*)$$

Although the voltage $V_{DSB}$ between drain and source of the FET QB is larger than (1*) just after the temperature sensor incorporated FET QA is turned to ON state, (1*) increases with an increase of the drain current $ID_{QA}$ and finally becomes larger than the voltage $VD_{6B}$ between drain and source of the FET QB. At this time, the output of the comparator CMP1 change from "H" level to "L" level so that the temperature sensor incorporated FET QA is changed to OFF state.

Assuming that the threshold of the voltage $V_{DSA}$ between drain and source when the temperature sensor incorporated FET QA is turned to OFF state is $V_{DSAth}$, a following equation is established.

$$V_{DSAth} - V_{DAS} = R2/(R1\|R3) \times V_{DSB} \quad (2^*)$$

The overcurrent determination value is determined by the (2*) equation. When the overcurrent determination value is changed, the variable resistor RV connected in parallel to the resistor R2 grounded to outside of the chip 110a is adjusted like the first embodiment. By this adjustment, the overcurrent determination value may be shifted downward.

Because an operation in the ohmic region and operation based on FIG. 8 are the same as the first embodiment, a description thereof is omitted.

Next, the overcurrent determination value will be described. Here, it is assumed that the overcurrent determination value uses the same value both in the pinch-off region and ohmic region.

First, $\Delta(V_{DSA}-V_{DSB})/\Delta ID$ in the pinch-off region is obtained. From the characteristic curve of HAF2001, a following equation is obtained.

$$\Delta V_{TGSA}/\Delta ID_{QA}=80 \text{ mV/A} \quad (4)$$

$$\Delta V_{TGSA} = \Delta(V_{DSA} - V_{DSB}) \times C_{TGD}/(C_{TGS} + C_{TGD}) \quad (5)$$

$$= \Delta(V_{DSA} - V_{DSB}) \times 1200\,\text{pF}/(1800\,\text{pF} + 1200\,\text{pF})$$

$$= \Delta(V_{DSA} - V_{DSB}) \times 0.4$$

From the equations (4), (5), $\Delta(V_{DSA}-V_{DSB})/\Delta ID=200$ mV/A . . . (6)

Further, from the equation (3), $\Delta(V_{DSA}-V_{DSB})/\Delta ID$ in the ohmic region is $\Delta(V_{DSA}-V_{DSB})/\Delta ID=30$ mV/A . . . (7)

Comparing the equations (6), (7) with each other, current sensitivity in the pinch-off region is higher than that in the ohmic region and therefore, there is a fear that an overcurrent determination value which is appropriate in the ohmic region is so low in the pinch-off region that it may be trapped frequently. As a countermeasure therefor, there is a method in which a different overcurrent determination value is used in each of the pinch-off region and ohmic region. According to this embodiment, the countermeasure circuit is added to the structure of the first embodiment.

Which the pinch-off region or ohmic region is determined depending on the magnitude of the voltage $V_{TGSA}$ between gate and source. Although the voltage $V_{TGSA}$ between gate and source in the pinch-off region increases with an increase of the drain current ID, it never exceeds 5 V even in case of complete short-circuit (dead short-circuit). Therefore, when the voltage $V_{TGSA}$ between gate and source is larger than 5 V, it can be determined that that value exists in the ohmic region.

Just after the temperature sensor incorporated FET QA is changed to ON state, the FET Q1 is in OFF state while the FET Q2 is in ON state. To change the FET Q1 to ON state, a voltage higher than the power supply voltage VB, for example, VB+5 V is necessary.

When Zener breakdown voltage of the Zener diode ZD2 is set to 5 V−1.6 V (threshold voltage of FET Q1), when the voltage $V_{TGSA}$ between gate and source becomes larger than 5 V, the FET Q1 is changed to ON state while the FET Q2 is changed to OFF state. Thus, the resistor R3 set in parallel to the resistor R2 is removed from the circuit.

Because compression rate of the voltage $V_{DSA}$ between drain and source decreases, the difference $V_{DSA}-V_{DSB}$ of the voltage between drain and source determined to be an overcurrent decreases further. As a result, a current value smaller than the previous one is determined to be overcurrent in the ohmic region.

However, even when no countermeasure is taken with an added circuit of this embodiment, there is a possibility that no problem exists in practical use. That is, when the final load current is small in the pinch-off region, the current rises up completely in the pinch-off region. Although the final load current value is reached in the pinch-off region, when the final load current value is large, the current is still on a rise in the pinch-off region and therefore, the current value in the pinch-off region is restricted to about 40 A max, even in case of complete short-circuit (dead short-circuit).

That is, with an increase of the final load current value, the current converges to a current rise-up characteristic having a predetermined gradient so that the difference of the voltage between drain and source is not so large as the difference of the final load current value. Because of this phenomenon, even when the current sensitivity in the pinch-off region is large, the difference $V_{DSA}-V_{DSB}$ of the voltage between drain and source is not increased. Thus, depending on selection of a current value in the reference voltage generating circuit, a power supply control unit for achieving overcurrent detecting protection for practical use can be achieved with a structure of the first embodiment even when a countermeasure with the added circuit is not employed unlike this embodiment.

The power supply control unit and power supply control method of this embodiment make the same effect as those described in detail about the first embodiment.

Finally here, a concept on overcurrent control will be summarized. Its basic concept is as follows. First when the temperature sensor incorporated FET QA is turned to ON state with wiring in normal state, the ohmic region is entered. As long as the wiring is normal, the ohmic region is kept so that the temperature sensor incorporated FET QA continues to be in ON state. Next, when the difference $V_{DSA}-V_{DSB}$ of the voltage between drain and source exceeds an overcurrent determination value because abnormality occurs in the wiring so that current increases, the temperature sensor incorporated FET QA is changed to OFF state, so that the pinch-off region is entered. As long as the abnormality in the wiring is continued, the transition from ON a Late to OFF state of the temperature sensor incorporated FET QA is repeated and the pinch-off region is kept, thereby finally reaching overheat shut-off.

To achieve the above basic concept and optimize control, the overcurrent determination value must satisfy the following two conditions. First, the temperature sensor incorporated FET QA never must be turned OFF in normal current region. Second, after overcurrent is determined in the ohmic region, as long as the abnormality of the wiring is not improved, the temperature sensor incorporated FET QA repeats transition from ON state to OFF state in the pinch-off region. This is necessary for stabilizing the ON/OFF control cycle. Stabilization of the ON/OFF control cycle leads to stabilization of control. Because the timer is set up using the ON/OFF control cycle (see the fifth embodiment described later), the stabilization of the cycle is necessary.

To satisfy the above first and second conditions, it is necessary to set the overcurrent determination value in the ohmic region to "normal current maximum value +α" and the overcurrent determination value in the pinch-off region to "normal current maximum value αβ". At this time, it is assumed that β>β. That is, α−β is an offset value necessary for keeping in the pinch-off region.

[Third Embodiment]

Figure 10:
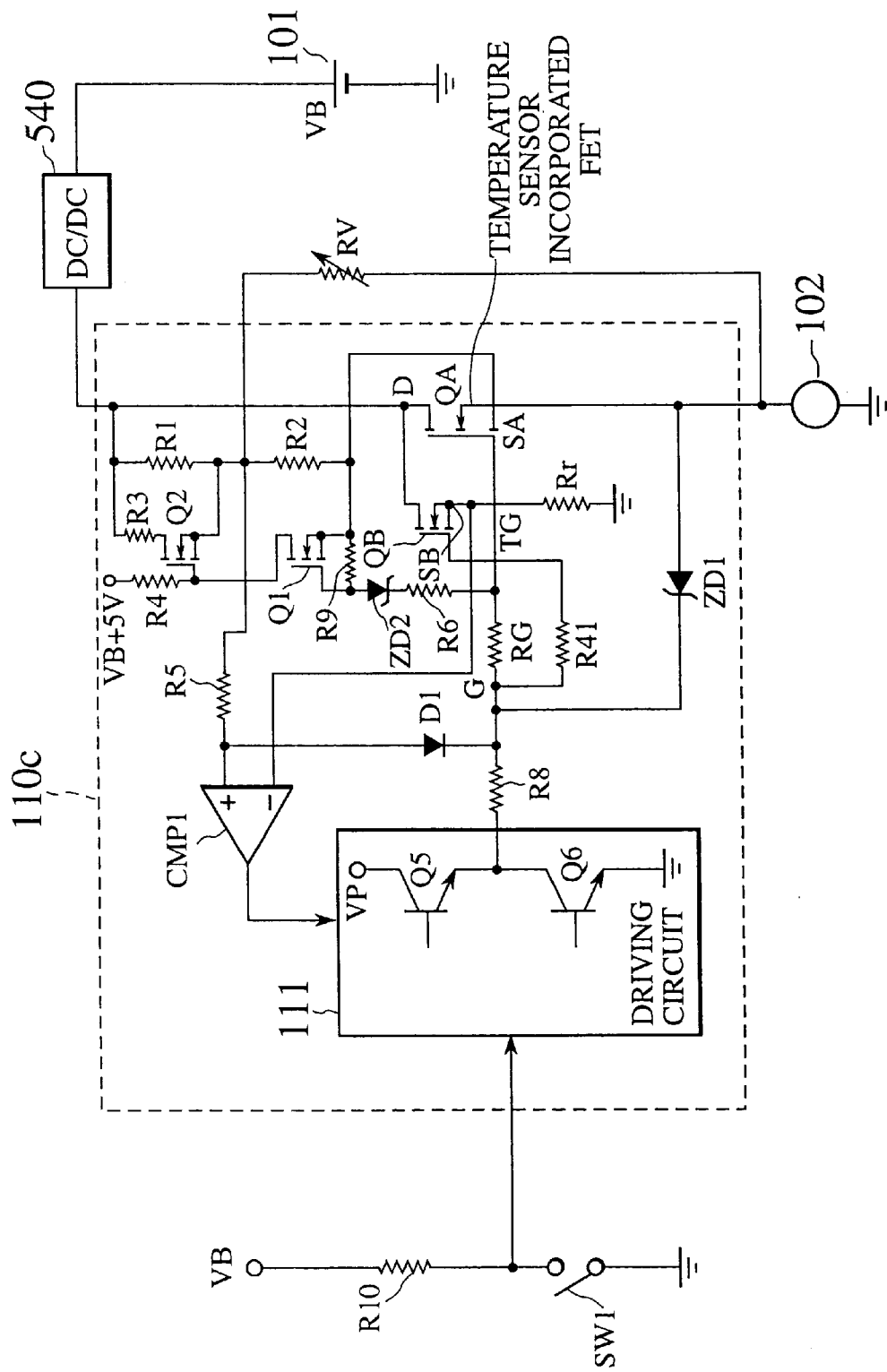
FIG. 10 is a circuit configuration diagram of a power supply control unit according to a third embodiment of the present invention.

The power supply control unit and power supply control method of the third embodiment will be described with reference to FIG. 10. What differs from the circuit structure (FIG. 9) of the power supply control unit of the second embodiment is that the gate of the FET QB is not connected to a real gate TG of the temperature sensor incorporated FET QA and R41 is added as a gate resistor of the FET QB while the other terminal of the resistor R41 is connected to gate G of the temperature sensor incorporated FET QA. The other content is the same as the circuit structure of the second embodiment. Meanwhile, a portion 110c surrounded by dot line of FIG. 10 indicates a chip portion to be analog-Integrated.

Further, the resistance of the resistor R41 needs to be set to R41=1000×R7. For example, when R7=10 KΩ, it comes that R41=10 MΩ. Because this is a very high resistance, when cost and productivity are taken into account, it is desirable that the ratio of the number of transistors is 1;100 so that R41 is 1 MΩ.

An operation of the power supply control unit of this embodiment is the same as the second embodiment and the same effect as the first embodiment is exerted.

[Fourth Embodiment]

Next, the power supply control unit and power supply control method of the fourth embodiment will be described with reference to FIG. 11. The power supply control unit of this embodiment is so constructed that a rush current mask circuit 105 and an overcurrent acceleration circuit 106 are added to the circuit structure (FIG. 3) of the power supply control unit of the first embodiment. A portion 110d surrounded by dot line of FIG. 11 indicates a chip portion to be analog-integrated.

When the load 102 (for example, head lamp) is turned ON, rush current several times to several ten times normal state flows. A period In which rush current flows differs depending on the kind or capacity of the load 102 and in from 3 msec to 20 msec. When the overcurrent control as described in the first, second and third embodiments is carried out in this period in which the rush current flows, it takes long until the load 102 reaches its normal state, so that a deterioration in the response of the load itself such as a delay in lighting of the lamp may occur. In this embodiment, adding the rush current mask circuit 105 (corresponds to an inhibit means mentioned In claims) solves this problem.

Although in the first, second and third embodiments, when an overcurrent due to complete short-circuit is detected, the overheat shut-off protective function is actuated immediately so as to carry out overheat shut-off (OFF control) of the temperature sensor incorporated FET QA. In case of incomplete short-circuit, the ON/OFF control of the temperature sensor incorporated FET QA is repeated so that the overheat shut-off function is actuated by cyclic heat generation of the temperature sensor incorporated FET QA.

Therefore, it can be considered that it takes longer until the overheat shut-off function is actuated. According to this embodiment, by adding the overheat shut-off acceleration circuit (overheat shut-off acceleration means) 106, the overheat shut-off of the temperature sensor incorporated FET QA is accelerated even in case of incomplete short-circuit.

Figure 11:
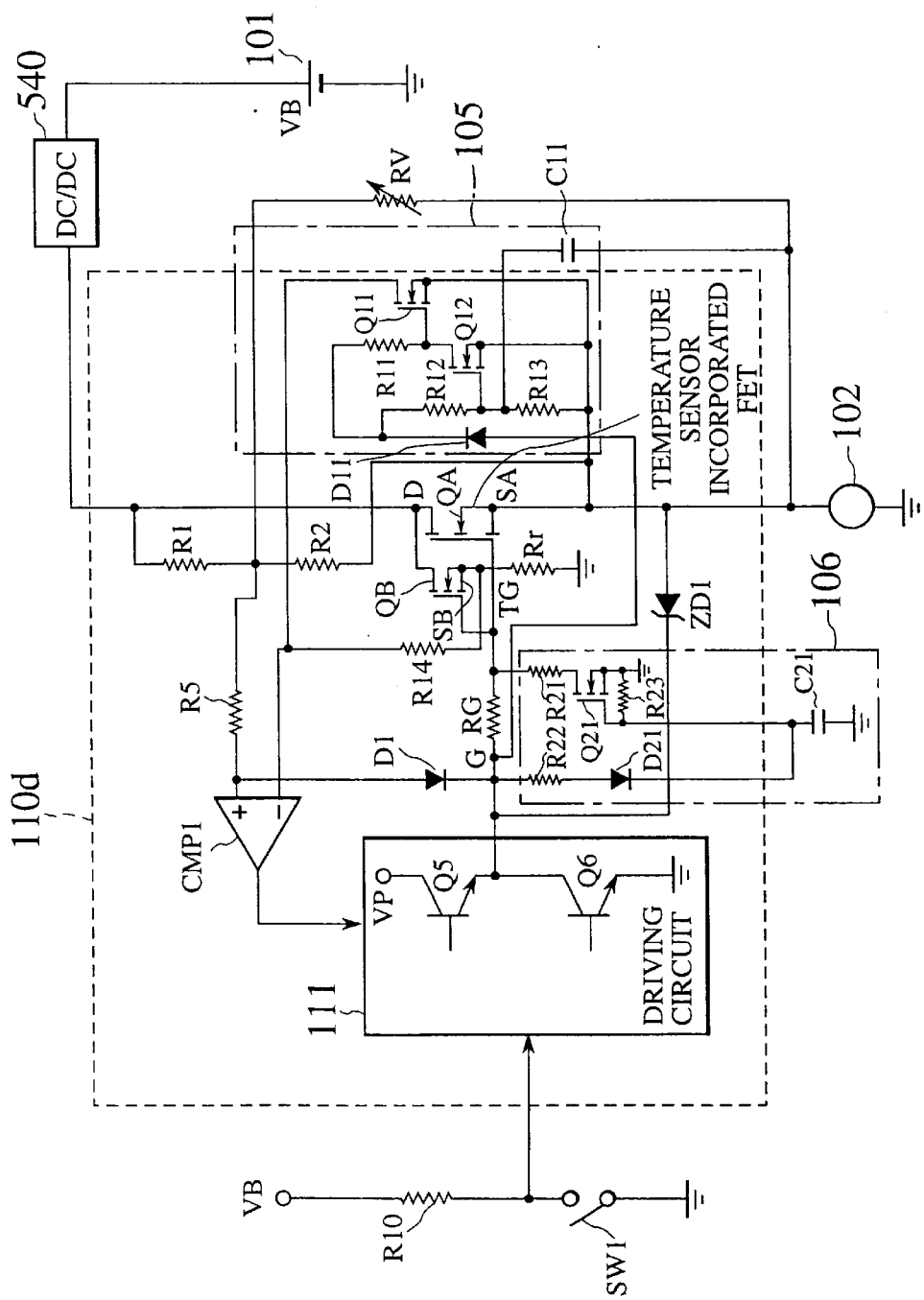
FIG. 11 is a circuit configuration diagram of a power supply control unit according to a fourth embodiment of the present invention.

Referring to FIG. 11, the rush current mask circuit 105 is so constructed with FET Q11, Q12, diode D11, resistors R11–R13 and capacitor C11.

Next, an operation of the rush current mask circuit will be described. When the temperature sensor incorporated FET QA is turned to ON state, the voltage Vow between drain and source is supplied to the FET Q12 through the diode D11 and resistor R12 and the voltage $V_{GSA}$ between gate and source is supplied to a gate of the FET Q11 through the diode D11 and resistor R11.

The gate of the FET Q12 is connected to the source SA of the temperature sensor incorporated FET QA through the capacitor C11. Just after the temperature sensor incorporated FET Q12 is changed to ON state, gate potential of the FET Q12 does not rise sufficiently so that the FET Q12 cannot be turned to ON state because the capacitor C11 is not yet charged. Further,because the FET Q11 is in ON state while the FET Q12 is in OFF state, a divided voltage supplied to the + terminal of the comparator CMP1 is connected to the source SA of the temperature sensor incorporated FET QA. Consequently, the output of the comparator CMP1 is maintained at "H" level so that even when a large rush current flows, the temperature sensor incorporated FET QA is not turned to OFF state.

With a passage of time, the capacitor C11 is charged through the resistor R12 and finally, the FET Q12 is changed to ON state. At the same time, the FET Q11 is changed to OFF state and the aforementioned mask condition ends so that the overcurrent detection function is actuated.

Meanwhile, the resistor R13 is a discharge resistance for resetting the capacitor C11 after the temperature sensor incorporated FET QA is turned to OFF state. It is desirable that the mask time is not affected by setting R12<<R13. Further, because the mask time is determined by a time constant of R12×C11, in case of integration to a single chip, the mask time can be adjusted by changing a capacity of the capacitor C11 arbitrarily.

Next, the overheat shut-off acceleration circuit 106 is constructed with FET Q21, diode D21, resistors R21–R23 and capacitor C21.

Next, an operation of the overheat shut-off acceleration circuit 106 will be described. After the overcurrent control is started, each time when the gate potential of the temperature sensor incorporated FET QA is changed to "H" level cyclically, the capacitor C21 is charged via the resistor R21 and reverse flow preventing diode D21. Although the FET Q21 is in OFF state because the gate potential of the FET Q21 is below the threshold value, the FET Q21 is turned to ON state when the gate potential rises with charging of the capacitor C21.

Current flows from the terminal TG (real gate of the temperature sensor incorporated FET QA) to a grounding potential (GND) through the resistor R21, so that electric charge accumulated to the terminal TG decreases. For the reason, the voltage $V_{DSA}$ between drain and source increases despite the same drain current ID so that power consumption in the temperature sensor incorporated FET QA increases thereby accelerating the overheat shut-off. The overheat shut-off is accelerated as the resistance R21 decreases. The resistance R23 is discharge resistance of the capacitor C21 and desired to be set such that R22>>R23.

[Fifth Embodiment]

Next, the power supply control unit and power supply control method of the fifth embodiment will be described with reference to FIG. 12. The power supply control unit of this embodiment is so constructed that an ON/OFF frequency integrating circuit 107 is added to the circuit structure (FIG. 3) of the power supply control unit of the first embodiment. A portion 110 surrounded by dot line of FIG. 12 indicates a chip portion to be analog-integrated.

According to the first, second and third embodiments, in case of incomplete short-circuit, the ON/OFF control of the temperature sensor incorporated FET QA is repeated so as to shut off overheat by cyclic heat generation of the temperature sensor incorporated FET QA. Thus, a problem that it takes long until the overheat shut-off is achieved is solved as follows according to this embodiment. That is, by adding the ON/OFF frequency integrating circuit (frequency control means) 107 which turns OFF the temperature sensor incorporated FET QA when the ON/OFF control frequency thereof reaches a predetermined value, the shut-off of the temperature sensor incorporated FET QA is accelerated.

Figure 12:
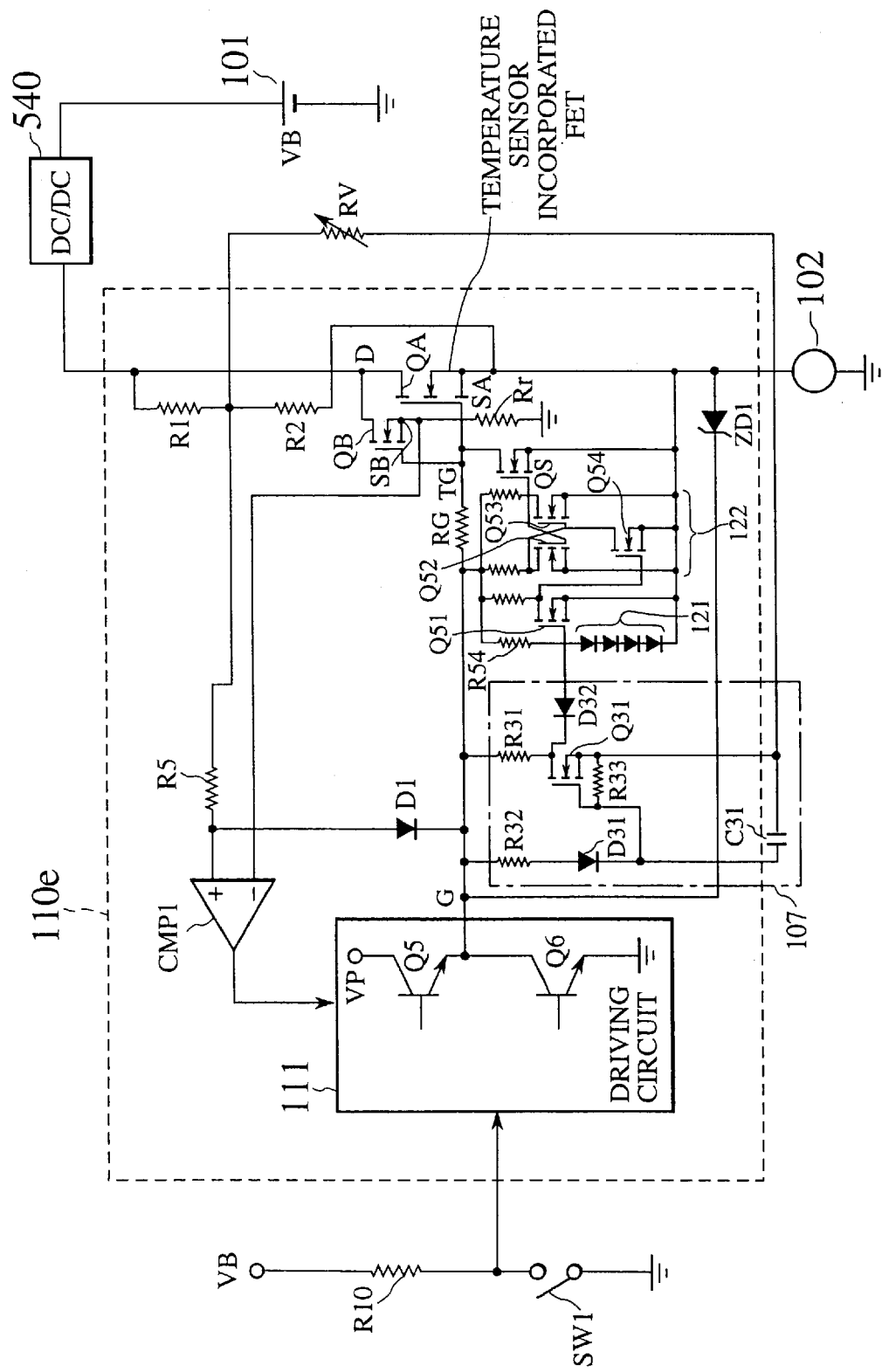
FIG. 12 is a circuit configuration diagram of a power supply control unit according to a fifth embodiment of the present invention.

Referring to FIG. 12, the ON/OFF frequency integrating circuit 107 is constructed with the FET Q31, diodes D31, D32, restitors R31–R33 and capacitor C31.

Next, an operation of the ON/OFF frequency integrating circuit 107 will be described. After the overcurrent control is initiated, each time when the gate potential of the temperature sensor incorporated FET QA becomes "H" level cyclically, the capacitor C31 s charged through the resistor R31 and reverse flow preventing diode D31. Although the FET Q31 is in OFF state because the gate potential thereof is initially below the threshold value, the FET Q31 to turned to ON state when the gate potential increases with charging of the capacitor C31. At this time, because the potential of anode side of the temperature sensor 121 (four diodes) is pulled down, the same condition as a nigh temperature condition is produced so that the overheat shut-off FET QS is turned to ON state so as to shut off the temperature sensor incorporated FET QA (off control).

Meanwhile, shut-off time by integration of the frequency is desired to be about 1 sec. To stabilize the operation of the ON/OFF frequency integrating circuit 107, it is necessary to stabilize the ON/OFF control of the temperature sensor incorporated FET QA. Because a change in the voltage $V_{DSA}$ between drain and source against a change in the load current is larger In the pinch-off region than in the ohmic region according to this embodiment, the temperature sensor incorporated FET QA is turned to OFF state in the pinch-off region during the ON/OFF control thereof (it is never turned to OFF state in the ohmic region after it passes the pinch-off region). Therefore, the cycle of the ON/OFF control of the temperature sensor incorporated FET QA is stabilized.

[Modification]

Next, a modification of the power supply control unit and power supply control method of the respective embodiments will be described with reference to FIG. 13. In the description of the respective embodiments, with the reference voltage generating means fixed (fixed to a load of 5 A in the above description), change of the third load (resistor Rr) is carried out by changing the overcurrent determination value. That is, the resistances R1, R2, R3 are set up corresponding to the maximum load so as to produce a chip and when the load 102 is small, the variable resistor RV is added in parallel to the resistor R2 outside the chip to lower the overcurrent determination value.

This method has the following problem. First, as the overcurrent determination value increases, control accuracy decreases. Second, it is necessary to use a different overcurrent determination value for each of the pinch-off region and ohmic region. In this case, the overcurrent determination value of the pinch-off region needs to be set up corresponding to a rise-up gradient of the drain current ID when speaking strictly. However, it is difficult to set up the overcurrent determination value accurately because the rise-up gradient of the drain current ID changes when the wiring inductance and wiring resistance change.

As its countermeasure, it is effective to set up the reference voltage generating means corresponding to the load 102. That is, first, a reference voltage generating means corresponding to the maximum current value of the load 102 is set up. Next, when the load driving transistor (namely, voltage $V_{DSA}$ between drain and source of the temperature sensor incorporated FET QA) exceeds a voltage $V_{DS}$ between drain and source (namely, voltage $V_{DSB}$ between drain and source of the FET QB) in the reference voltage generating means even when it is small, it is determined to be an overcurrent value.

According to this method, the overcurrent determination value does not have to be changed for each of the pinch-off region and ohmic region. Because it may be determined by determining whether or not the voltage $V_{DS}$ between drain and source in the reference voltage generating means is exceeded, detecting accuracy is determined by only resolution of the comparator CMP1.

Further, temperature drift, deviation between IC lots and influences of wiring inductance and wiring resistance can be removed and a deviation of the power supply voltage does not make influence as long as the comparator CMP1 is operated properly. Therefore, a power supply control unit and power supply control method having little error factors can be achieved.

Upon changing the setting of the reference voltage generating means, although the variable resistor RV may be added in parallel to the resistor Rr outside, this may be carried out by changing the resistance Rr in the chip.

Figure 13:
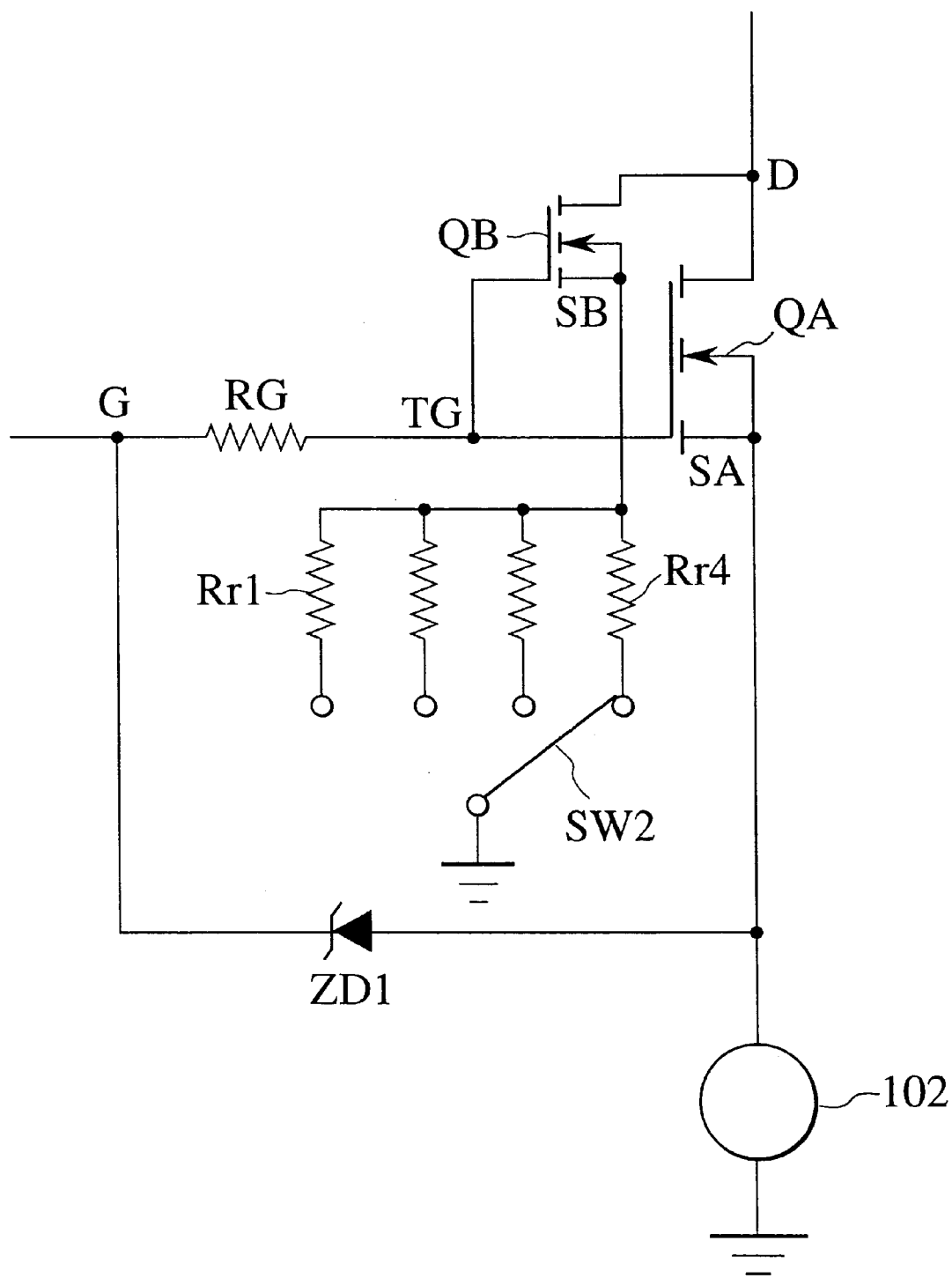
FIG. 13 is a circuit diagram for explaining a structure of a third load (resistor) in a power supply control unit of a modification.

As shown in FIG. 13, several kinds of the resistors Rr1–Rr4 are disposed inside the chip. Then, when a chip is packaged or a bear chip is installed, any one of the resistors Rr1–Rr4 is selectively connected by means of switch SW2. As a result, a set value of the reference voltage generating means may be set in a target specification. As a result, even when the power supply control unit is integrated, plural specifications may be covered by a single kind of the chip. Further, by setting the resistance variably, the complete short-circuit and incomplete short-circuit can be detected separately depending on the kind of the load (head lamp, driving motor and the like) securely so that protection against short-circuit fault can be achieved accurately.

To the circuit structure of the power supply control unit according to the first, second, third, fourth and fifth embodiments and modification described above, n-channel type is used for the switching elements, that is, temperature sensor incorporated FET QA, FET QB, transistors Q5, Q6, overheat shut-off FFT QS and FET Q11–Q54. However, the circuit structure of the power supply control unit of the present invention is not restricted to this embodiment, however, P-channel type may be used. However, in this case, a circuit modification is necessary because the gate potential for carrying out the ON/OFF control of each switching element is reversed to "L"/"H" level.

As described above, according to the power supply control unit and power supply control method of the present invention, the charge pump circuit can be eliminated in design of a power source having plural voltages, and a power supply control unit having a simple structure and a high reliability can be provided.

Further, because supply of electric power to a load requiring a low voltage can be carried out through a current vibration type shut-off function provided switching circuit, abnormality of current such as rare short-circuit, ordinary short-circuit and excessive current can be detected by monitoring current and when an abnormality is detected, the power supply can be shut down.

Further, the conventional shunt resistor becomes unnecessary, so that heat loss of the unit can be suppressed. An abnormal current can be detected continuously by a hardware circuit or programming on microcomputer or the like. Specifically, when the ON/OFF control of the semiconductor switch is composed of a hardware circuit, the microcomputer becomes unnecessary, so that the installation space can be reduced and further, production cost of the unit can be reduced largely.

It should be understood that many modifications and adaptations of the invention will become apparent to those skilled in the art and it is intended to encompass such obvious modifications and changes in the scope of the claims appended hereto.

What is claimed is:

1. A power supply control unit comprising:
   a power transmission means for supplying a power from a power source to a first load;
   an auxiliary power means for generating at least a kind of voltage different from a voltage of said power source;
   a semiconductor switch for controlling a power supply to a second load from said auxiliary power means by switching control depending on a control signal supplied to a control signal input terminal thereof;
   a reference voltage generating means for generating a reference voltage having a voltage characteristic equivalent to the voltage characteristic of a voltage between terminals of the semiconductor switch when a predetermined load is connected thereto;
   a detecting means for detecting a difference between a voltage between the terminals of the semiconductor switch and said reference voltage;
   a control means for controlling ON/OFF Of said semiconductor switch depending on a difference between the detected voltage between the terminals and the reference voltage; and
   a control reference voltage supply means for supplying a voltage serving for a reference of control to said control means.

2. A power supply control unit according to claim 1, wherein said reference voltage generating means comprises a circuit which is connected in parallel to said semiconductor switch and said second load and in which a second semiconductor switch controlled by switching depending on said control signal and a third load are connected in series, said reference voltage generating means generating a voltage between terminals of said second semiconductor switch as said reference voltage.

3. A power supply control unit according to claim 1, wherein the voltage characteristic possessed by the reference voltage of said reference voltage generating means is equivalent to the voltage characteristic in a condition that a target current which is maximum current in normal operating range flows to said semiconductor switch and said second load.

4. A power supply control unit according to claim 2, wherein said semiconductor switch and said second semiconductor switch have equivalent characteristic about a transient voltage characteristic of a voltage between the terminals at the time of change from OFF state to ON state.

5. A power supply control unit according to claim 2, wherein a current capacity of said second semiconductor switch is smaller than the current capacity of said semiconductor switch and a ratio of resistance between said second load and said third load is equivalent to a ratio of the current capacity between said semiconductor switch and said second semiconductor switch.

6. A power supply control unit according to claim 2, wherein said third load has plural resistors and a resistance of said third load is changed and set by connecting selectively any one of said plural resistors.

7. A power supply control unit according to claim 2, further comprising a variable resistor connected to said second load in series or connected to said third load in parallel wherein a resistance of said third load is changed and set by said variable resistor.

8. A power supply control unit according to claim 1, wherein said control means turns OFF said semiconductor switch when a difference between a detected voltage between the terminals and the reference voltage exceeds a first threshold value and turns ON said semiconductor switch when a difference between the detected voltage between the terminals and the reference voltage drops below a second threshold value.

9. A power supply control unit according to claim 1, further comprising an overheat protecting means for protecting said semiconductor switch by OFF control when said semiconductor switch is overheated.

10. A power supply control unit according to claim 1, wherein said semiconductor switch, said reference voltage generating means, said detecting means, said control means and said overheat protecting means are formed on a same chip.

11. A power supply control unit according to claim 1, wherein a cycle of ON/OFF control of said semiconductor switch by said control means is used as a control clock.

12. A power supply control unit according to claim 1, further comprising an inhibit means for inhibiting ON/OFF control of said semiconductor switch by said control means in a predetermined period after said semiconductor switch is turned to ON state.

13. A power supply control unit according to claim 9, further comprising an overheat shut-off accelerating means for accelerating OFF control by said overheat protecting means during ON/OFF control of said semiconductor switch by said control means.

14. A power supply control unit according to claim 1, further comprising a frequency control means for integrating ON/OFF control frequency of said semiconductor switch by said control means and when the control frequency reaches a predetermined frequency, turning OFF said semiconductor switch.

15. A power supply control method using a power supply control unit comprising:

a power transmission means for supplying a power from a power source to a first load; an auxiliary power means for generating at least a kind of voltage different from a voltage of said power source; and a semiconductor switch for controlling a power supply to a second load from said auxiliary power means by switching control depending on a control signal supplied to a control signal input terminal thereof, said power supply control method comprising:

a reference voltage generating step for generating a reference voltage having a voltage characteristic equivalent to the voltage characteristic of a voltage between terminals of the semiconductor switch when a predetermined load is connected thereto;

a detecting step for detecting a difference between a voltage between the terminals of the semiconductor switch and said reference voltage;

a control step for controlling ON/OFF Of said semiconductor switch depending on a difference between the detected voltage between the terminals and the reference voltage; and a control reference voltage supply step for supplying a voltage serving for a reference of control to said control means.

16. A power supply control method according to claim 15, wherein in said reference voltage generating step, the voltage characteristic possessed by said reference voltage is equivalent to the voltage characteristic in a condition that a target current which is maximum current in normal operating range flows to said semiconductor switch and said second load.

17. A power supply control method according to claim 15, wherein said control step comprises an OFF control step for turning OFF said semiconductor switch when a difference between a detected voltage between the terminals and the reference voltage exceeds a first threshold value; and an ON control step for turning ON said semiconductor switch when the difference between the detected voltage between the terminals and the reference voltage drops below a second threshold value.

18. A power supply control method according to claim 15, further comprising an overheat protecting step for protecting said semiconductor switch by OFF control when said semiconductor switch is overheated.

19. A power supply control method according to claim 15, further comprising an inhibit step for inhibiting ON/OFF control of said semiconductor switch by said control step in a predetermined period after said semiconductor switch is turned to ON state.

20. A power supply control method according to claim 18, wherein the OFF control by said overheat protecting step is accelerated at the time of ON/OFF control of said semiconductor switch by said control step.

21. A power supply control method according to claim 15, further comprising a frequency control step for integrating ON/OFF control frequency of said semiconductor switch by said control step and when the control frequency reaches a predetermined frequency, turning OFF said semiconductor switch.

* * * * *

UNITED STATES PATENT AND TRADEMARK OFFICE
CERTIFICATE OF CORRECTION

PATENT NO. : 6,335,577 B1
DATED : January 1, 2002
INVENTOR(S) : Akira Baba

It is certified that error appears in the above-identified patent and that said Letters Patent is hereby corrected as shown below:

Column 22,
Line 43, "Of said" should read -- of said --.
Line 54, "semionductor" should read -- semiconductor --.

Column 24,
Line 15, "Of said" should read -- of said --.

Signed and Sealed this

Seventh Day of May, 2002

Attest:

Attesting Officer

JAMES E. ROGAN
Director of the United States Patent and Trademark Office